United States Patent
Yun et al.

(10) Patent No.: US 10,559,577 B2
(45) Date of Patent: Feb. 11, 2020

(54) NON-VOLATILE MEMORY DEVICES AND METHODS OF FABRICATING THE SAME

(71) Applicant: Samsung Electronics Co., Ltd., Suwon-si, Gyeonggi-do (KR)

(72) Inventors: Dong-kil Yun, Hwaseong-si (KR); Chan-ho Kim, Seoul (KR); Pan-suk Kwak, Seoul (KR); Hong-soo Jeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/914,168

(22) Filed: Mar. 7, 2018

(65) Prior Publication Data
US 2019/0067308 A1 Feb. 28, 2019

(30) Foreign Application Priority Data
Aug. 24, 2017 (KR) .................. 10-2017-0107407

(51) Int. Cl.
*H01L 27/11526* (2017.01)
*H01L 27/11529* (2017.01)
*H01L 29/94* (2006.01)
*H01L 27/11556* (2017.01)
*H01L 27/112* (2006.01)
*H01L 27/108* (2006.01)
*G11C 16/08* (2006.01)
*G11C 16/04* (2006.01)
*G11C 11/56* (2006.01)

(52) U.S. Cl.
CPC .. *H01L 27/11529* (2013.01); *H01L 27/10897* (2013.01); *H01L 27/11286* (2013.01); *H01L 27/11526* (2013.01); *H01L 27/11556* (2013.01); *H01L 29/94* (2013.01); *G11C 11/5621* (2013.01); *G11C 16/0483* (2013.01); *G11C 16/08* (2013.01)

(58) Field of Classification Search
CPC ................. H01L 27/07; H01L 27/0711; H01L 27/11286; H01L 27/11514
See application file for complete search history.

(56) References Cited

U.S. PATENT DOCUMENTS

| 9,330,761 | B2 | 5/2016 | Maejima |
| 9,385,137 | B2 | 7/2016 | Omura |
| 9,455,271 | B1 | 9/2016 | Setta |
| 9,548,316 | B2 | 1/2017 | Lim et al. |
| 9,595,346 | B2 | 3/2017 | Lee et al. |

(Continued)

OTHER PUBLICATIONS

Singapore Office Action dated Aug. 10, 2018 in corresponding Singapore Application No. 10201804119S.

*Primary Examiner* — Cheung Lee
(74) *Attorney, Agent, or Firm* — Harness, Dickey & Pierce, P.L.C.

(57) ABSTRACT

A non-volatile memory device may include a first semiconductor layer including a peripheral region, the peripheral region including one or more peripheral transistors on a lower substrate. The non-volatile memory device may further include a second semiconductor layer on the peripheral region, the second semiconductor layer including an upper substrate, the second semiconductor layer further including a memory cell array on the upper substrate. The upper substrate may include a first upper substrate on the first semiconductor layer, a first layer on the first upper substrate, and a second upper substrate on the first layer.

18 Claims, 23 Drawing Sheets

(56) References Cited

U.S. PATENT DOCUMENTS

| | | |
|---|---|---|
| 9,666,289 B2 | 5/2017 | Lee et al. |
| 2011/0103149 A1 | 5/2011 | Katsumata et al. |
| 2015/0372005 A1 | 12/2015 | Yon et al. |
| 2016/0190147 A1 | 6/2016 | Kato et al. |
| 2016/0240547 A1 | 8/2016 | Tagami et al. |
| 2016/0307632 A1 | 10/2016 | Lee et al. |
| 2016/0343450 A1 | 11/2016 | Lee et al. |
| 2017/0047343 A1 | 2/2017 | Lee et al. |
| 2017/0213843 A1 | 7/2017 | Choi |

NON-VOLATILE MEMORY DEVICES AND METHODS OF FABRICATING THE SAME

CROSS-REFERENCE TO RELATED APPLICATION

This application claims the benefit, under 35 U.S.C. § 119, of Korean Patent Application No. 10-2017-0107407, filed on Aug. 24, 2017, in the Korean Intellectual Property Office, the disclosure of which is incorporated herein in its entirety by reference.

BACKGROUND

The inventive concepts relate to memory devices, and more particularly, to non-volatile memory devices and methods of fabricating the same.

Recently, along with the multi-functionalization of data communication devices, there are demands for increased capacity and higher integration of memory devices. As the memory cell size is reduced for high integration, operating circuits and/or wiring wires in memory devices for operations and electrical connections of the memory device are becoming more complex. Therefore, memory devices having excellent electrical characteristics with improved integration are demanded.

SUMMARY

Some example embodiments provide a non-volatile memory including an upper substrate.

According to some example embodiments, a non-volatile memory device may include a first semiconductor layer and a second semiconductor layer. The first semiconductor layer may include a peripheral region. The peripheral region may include one or more peripheral transistors on a lower substrate. The second semiconductor layer may be on the peripheral region. The second semiconductor layer may include an upper substrate. The second semiconductor layer may further include a memory cell array on the upper substrate. The upper substrate may include a first upper substrate on the first semiconductor layer, a first layer on the first upper substrate, and a second upper substrate on the first layer.

According to some example embodiments, a non-volatile memory device may include a lower substrate, a peripheral region on the lower substrate, the peripheral region including a peripheral circuit on the lower substrate, and a memory cell region on the peripheral region. The memory cell region may include an upper substrate. The memory cell region may further include a memory cell array on the upper substrate. The upper substrate may include a first upper substrate, a second upper substrate above the first upper substrate, and a first layer between the first upper substrate and the second upper substrate.

According to some example embodiments, a non-volatile memory device may include a memory cell region including a memory cell array, and a peripheral region including a peripheral circuit. The memory cell region may be on the peripheral region. The non-volatile memory device may include an upper substrate between the peripheral region and the memory cell region. The upper substrate may include a first upper substrate on the peripheral region, a first layer on the first upper substrate, and a second upper substrate on the first layer.

According to some example embodiments, a method of fabricating a non-volatile memory device may include forming one or more peripheral transistors on a portion of a lower substrate, the one or more peripheral transistors connected to a plurality of peripheral circuit wires, a lower insulation layer covering the one or more peripheral transistors and the peripheral circuit wires. The method may include forming a first upper substrate on the lower insulation layer, forming a first layer on the first upper substrate, forming a second upper substrate on the first layer, and forming a memory cell region on the second upper substrate, the memory cell region including a memory cell array.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
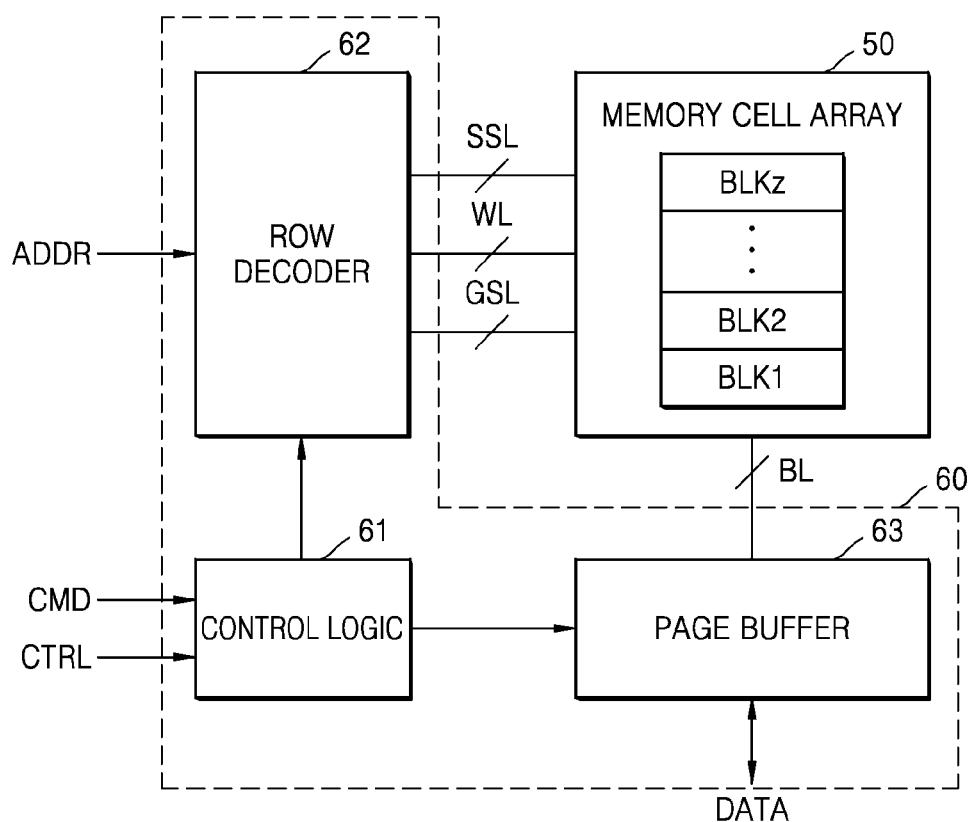
FIG. 1 is a block diagram showing a memory device according to some example embodiments.

FIG. 1 is a block diagram showing a memory device according to some example embodiments.

Referring to FIG. 1, a memory device 10 may include a memory cell array 50 and a peripheral circuit 60. Although not shown, the memory device 10 may further include a data input/output circuit and/or an input/output interface.

The memory cell array 50 includes a plurality of memory cells and may be connected to string select lines SSL, word lines WL, ground select lines GSL, and bit lines BL. Specifically, the memory cell array 50 may be connected to a row decoder 62 through string select lines SSL, word lines WL, and ground select lines GSL and may be connected to a page buffer 63 through bit lines BL.

The plurality of memory cells included in the memory cell array 50 may be, for example, flash memory cells. Hereinafter, example embodiments will be described in detail with reference to a case where the plurality of memory cells are NAND flash memory cells. However, the inventive concepts are not limited thereto. According to some example embodiments, the plurality of memory cells may be resistive memory cells, such as resistive RAM (RRAM) memory cells, phase change RAM (PRAM) memory cells, or magnetic RAM (MRAM) memory cells.

The memory cell array 50 may include a plurality of blocks BLK1 through BLKz, and each block may have a planar structure or a 3-dimensional structure. The memory cell array 50 may include at least one cell block of a single level cell block including single level cells (SLCs), a multi level cell block including multi level cells (MLCs), a triple level cell block including triple level cells (TLCs), and a quad level cell block including quad level cells. For example, some cell blocks of the plurality of blocks BLK1 through BLKz may be single level cell blocks, and the other blocks may be multilevel cell blocks, triple level cell blocks, or quad level cell blocks.

The peripheral circuit 60 may receive an address ADDR, a command CMD, and a control signal CTRL from a device outside of the memory device 10 and may exchange data DATA with the device outside the memory device 10. The peripheral circuit 60 may include control logic 61, the row decoder 62, and the page buffer 63. Although not shown, the peripheral circuit 60 may further include various sub-circuits, such as a voltage generating circuit for generating various voltages for operations of the memory device 10 and an error correcting circuit for correcting errors of data read from the memory cell array 50.

The control logic 61 controls the overall operation of the memory device 10 and may control the memory device 10, such that a memory operation corresponding to a command CMD provided from a memory controller (not shown) may be performed. The control logic 61 may generate various internal control signals used in the memory device 10 in response to a control signal CTRL provided from the memory controller (not shown). For example, the control logic 61 may adjust levels of voltages provided to the word lines WL and the bit lines BL during a memory operation, such as a program operation or an erase operation.

The row decoder 62 may select at least one block of the plurality of blocks BLK1 through BLKz in response to an address ADDR provided from a memory controller (not shown). The row decoder 62 may select at least one word line of a selected memory block in response to the address ADDR.

The row decoder 62 may transfer a voltage for performing a memory operation to a word line of a selected memory block. For example, during a program operation, the row decoder 62 may transfer a program voltage and a verification voltage to a selected word line and transfer a pass voltage to unselected word lines. Here, the selected word line may refer to a word line connected to a memory cell in which a program operation is to be performed, and the unselected word line may refer to a word line other than the selected word line. Furthermore, the row decoder 62 may select some string select lines SSL in response to an address ADDR.

The page buffer 63 may be connected to the memory cell array 50 through the bit lines BL. The page buffer 63 may operate as a write driver or a sense amplifier. The page buffer 63 may operate as a write driver and apply a voltage corresponding to data DATA to be stored in the memory cell array 50 to the bit lines BL. Meanwhile, during a read operation, the page buffer 63 may operate as a sense amplifier and sense data DATA stored in the memory cell array 50.

Figure 2:
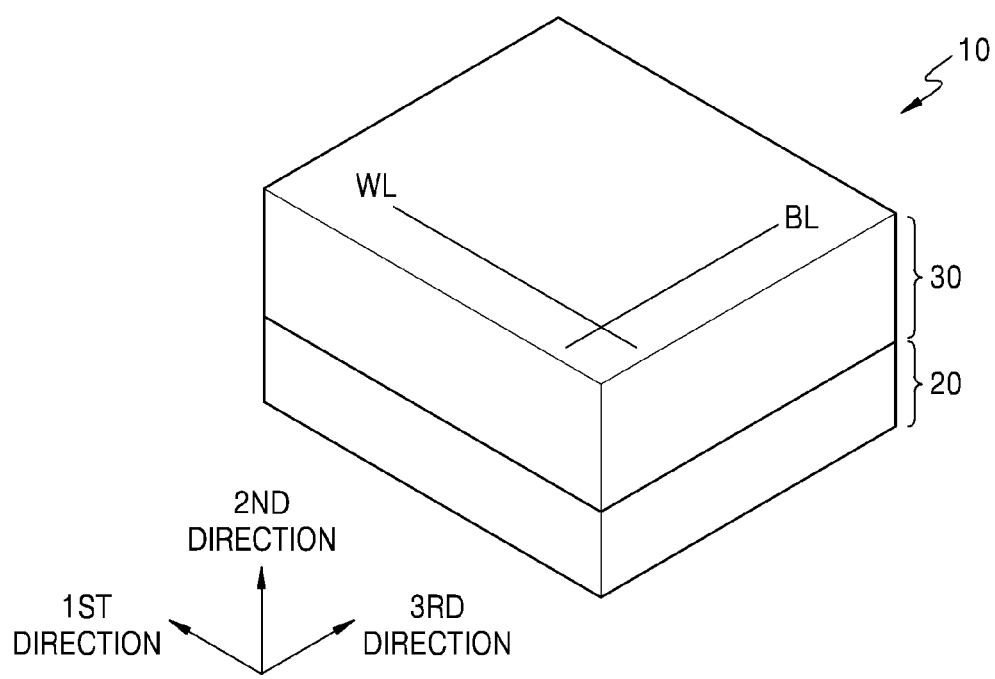
FIG. 2 is a diagram schematically showing the structure of the memory device of FIG. 1 according to some example embodiments of the inventive concepts.

FIG. 2 is a diagram schematically showing the structure of the memory device 10 of FIG. 1 according to some example embodiments of the inventive concepts. As described above with reference to FIG. 1, the memory device 10 may include a memory cell array 50 and a peripheral circuit 60, and such components of the memory device 10 may be provided through a semiconductor manufacturing process. Hereinafter, FIG. 2 will be described with reference to FIG. 1.

Referring to FIG. 2, the memory device 10 may include a first semiconductor layer 20 and a second semiconductor layer 30. The second semiconductor layer 30 may be stacked in a second direction on the first semiconductor layer 20. Restated, the second semiconductor layer 30 may be on the first semiconductor layer 20. The second semiconductor layer 30 may be directly on the first semiconductor layer 20, such that no intervening elements are present between the second semiconductor layer 30 and the first semiconductor layer 20, and the second semiconductor layer 30 is in direct contact with the first semiconductor layer 20. According to some example embodiments of the inventive concepts, the second semiconductor layer 30 may include the memory cell array 50 of FIG. 1, and the first semiconductor layer 20 may include the peripheral circuit 60. In other words, the first semiconductor layer 20 may include a lower substrate and one or more circuits, e.g., one or more circuits ("at least one instance of electrical circuitry") corresponding to the control logic 61, the row decoder 62, and the page buffer 63, may be formed on the first semiconductor layer 20 based on forming semiconductor devices, such as transistors, and a pattern for wiring the semiconductor devices on the lower substrate.

After the one or more circuits are formed in the first semiconductor layer 20, the second semiconductor layer 30 including the memory cell array 50 may be formed. In other words, the second semiconductor layer 30 may include an upper substrate, and the memory cell array 50 may be formed on the upper substrate and supported by the upper substrate.

According to some example embodiments, the upper substrate supporting the memory cell array 50 may include a first upper substrate, a second upper substrate above ("on") the first upper substrate, and a first layer between the first upper substrate and the second upper substrate. In other words, the upper substrate may be separated into the first upper substrate and the second upper substrate that is disposed apart from ("spaced apart from") the first upper substrate, and at least one layer may be disposed between ("may be between") the first upper substrate and the second upper substrate.

Furthermore, patterns for electrically interconnecting the memory cell array 50 (that is, word lines WL and bit lines BL) and the circuits formed in the first semiconductor layer 20 may be disposed in the second semiconductor layer 30. On the second semiconductor layer 30 having disposed therein (e.g., "including") the memory cell array 50, a plurality of word lines WL may extend in a first direction, which is a direction perpendicular to a stacking direction (the second direction), and a plurality of bit lines BL may also extend in a third direction, which is another direction perpendicular to the stacking direction (the second direction). As described above, the memory cells included in the memory cell array 50 may be accessed by the plurality of word lines WL and the plurality of bit lines BL, and the plurality of word lines WL and the plurality of bit lines BL may be electrically connected to the peripheral circuit 60 disposed in the first semiconductor layer 20.

Therefore, the memory device 10 may have a structure in which the memory cell array 50 and the peripheral circuit 60 are arranged in the stacking direction (that is, the second direction), that is, a cell-on-peri (or cell-over-peri) (COP) structure. By disposing the circuits except the memory cell array 50 below the memory cell array 50, the area the COP structure occupies on the plane perpendicular to the stacking direction, and thus the area of the structure in at least one plane, may be effectively reduced, thereby increasing the number of memory cells in the memory device 10. As a result, integration and/or density of the memory device 10 may be improved.

Although not shown in FIG. 2, a plurality of pads may be disposed for electrical connection with a device outside the memory device 10. For example, a plurality of pads may be disposed for commands CMD, addresses ADDR, and control signals CTRL received from a device outside the memory device 10, and a plurality of pads for inputting/outputting data DATA may be disposed. The plurality of pads may be disposed adjacent to the peripheral circuit 60, which processes signals received from a device outside the memory device 10 or signals to be transmitted to a device outside the memory device 10, in a vertical direction (the third direction) or a horizontal direction (the first direction or the third direction).

Figure 3:
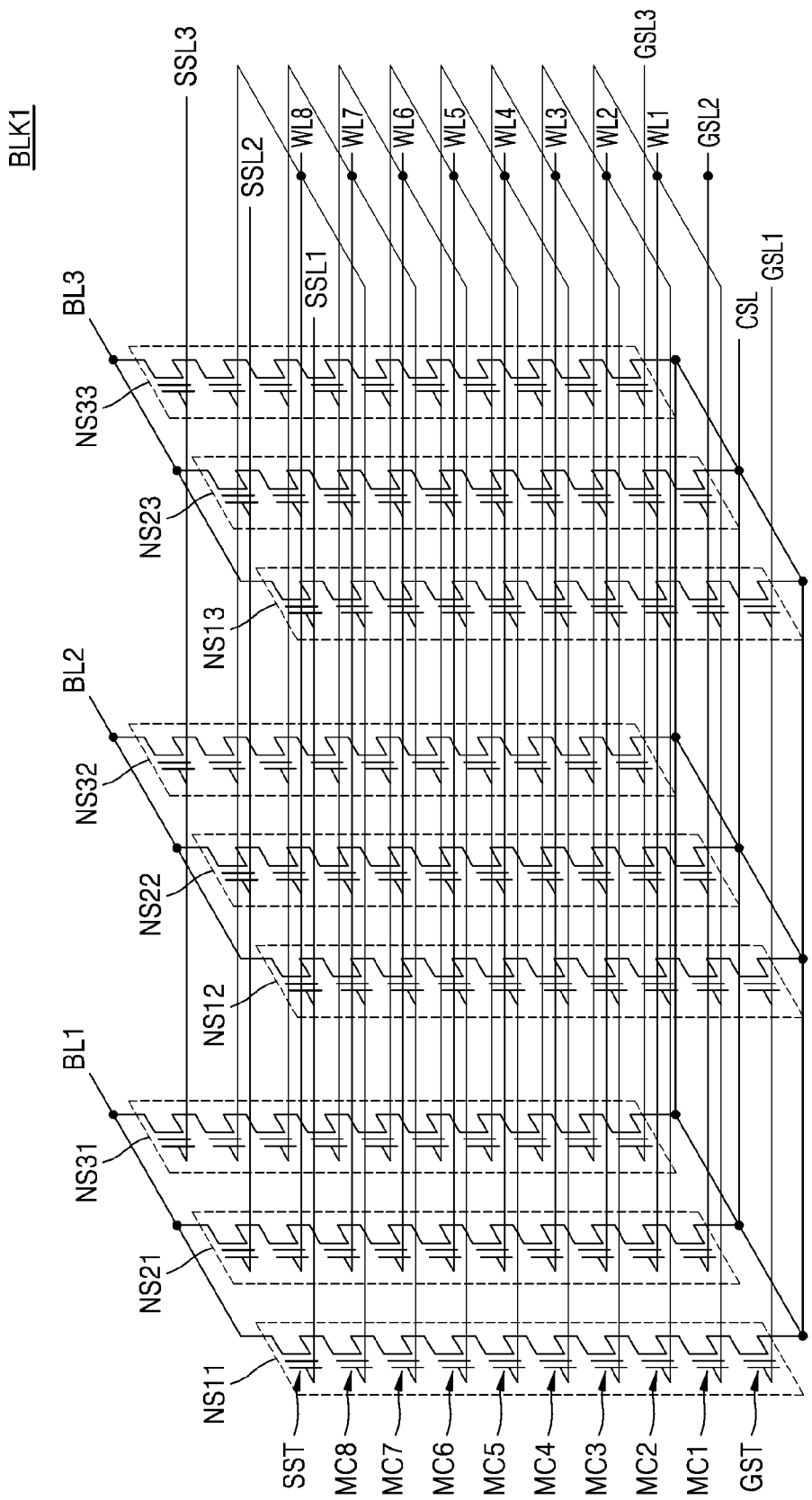
FIG. 3 is a circuit diagram showing an equivalent circuit of a first memory block, which is one of a plurality of memory blocks of FIG. 1, according to some example embodiments of the inventive concepts.

FIG. 3 is a circuit diagram showing an equivalent circuit of a first memory block BLK1, which is one of the plurality of memory blocks BLK1 through BLKz of FIG. 1, according to some example embodiments of the inventive concepts.

Referring to FIG. 3, the first memory block BLK1 may be a vertical NAND flash memory, and each of the plurality of memory block BLK1 through BLKz shown in FIG. 1 may be implemented as shown in FIG. 3. The first memory block BLK1 may include a plurality of NAND strings NS11 through NS33, a plurality of word lines WL1 through WL7, a plurality of bit lines BL1 through BL3, a plurality of ground select lines GSL1 through GSL3, a plurality of string select lines SSL1 through SSL3, and a common source line CSL. Here, the number of NAND strings, the number of word lines, the number of bit lines, the number of ground select lines, and the number of string select lines may vary according to embodiments.

NAND strings NS11, NS21 and NS31 are provided between a first bit line BL1 and the common source line CSL, NAND strings NS12, NS22, and NS32 are provided between a second bit line BL2 and the common source line CSL, and NAND strings NS13, NS23, and NS33 are provided between the third bit line BL3 and the common source line CSL. Each NAND string (e.g., the NAND string NS11) may include a string select transistor SST, a plurality of memory cells MC1 through MC8, and a ground select transistor GST that are connected to one another in series.

NAND strings connected to one bit line in common may constitute one column. For example, the NAND strings NS11, NS21 and NS31 connected to the first bit line BL1 in common may correspond to a first column, the NAND strings NS12, NS22, and NS32 connected to the second bit line BL2 in common may correspond to a second column, and the NAND strings NS13, NS23, and NS33 connected to the third bit line BL3 in common may correspond to a third column.

NAND strings connected to a single string select line in common may constitute one row. For example, NAND strings NS11, NS12, and NS13 connected to a first string select line SSL1 in common may correspond to a first row, NAND strings NS21, NS22, and NS23 connected to a second string select line SSL2 in common may correspond to a second row, and NAND strings NS31, NS32, and NS33 connected to a third string select line SSL3 in common may correspond to a third row.

Each string select transistor SST may be connected to a corresponding one of the plurality of string select lines SSL1 through SSL3. The plurality of memory cells MC1 through MC8 may be connected to corresponding word lines WL1 through WL8 respectively. The ground select transistor GST may be connected to a corresponding one of the plurality of ground select lines GSL1 through GSL3, and each string select transistor SST may be connected to a corresponding one of the plurality of bit lines BL1 through BL3. The ground select transistor GST may be connected to the common source line CSL.

According to some example embodiments, word lines (e.g., first word lines WL1) at a same height are connected to one another in common, the plurality of string select lines SSL1 through SSL3 are separated from one another, and the plurality of ground select lines GSL1 through GSL3 are also separated from one another. For example, in the case of programming memory cells included in the NAND strings NS11, NS12, and NS13 connected to the first word lines WL1 and corresponding to the first column, the first word lines WL1 and the first string select lines SSL1 are selected. However, the inventive concepts are not limited thereto. According to some example embodiments, the plurality of ground select lines GSL1 through GSL3 may be connected to one another in common.

Figure 4A:
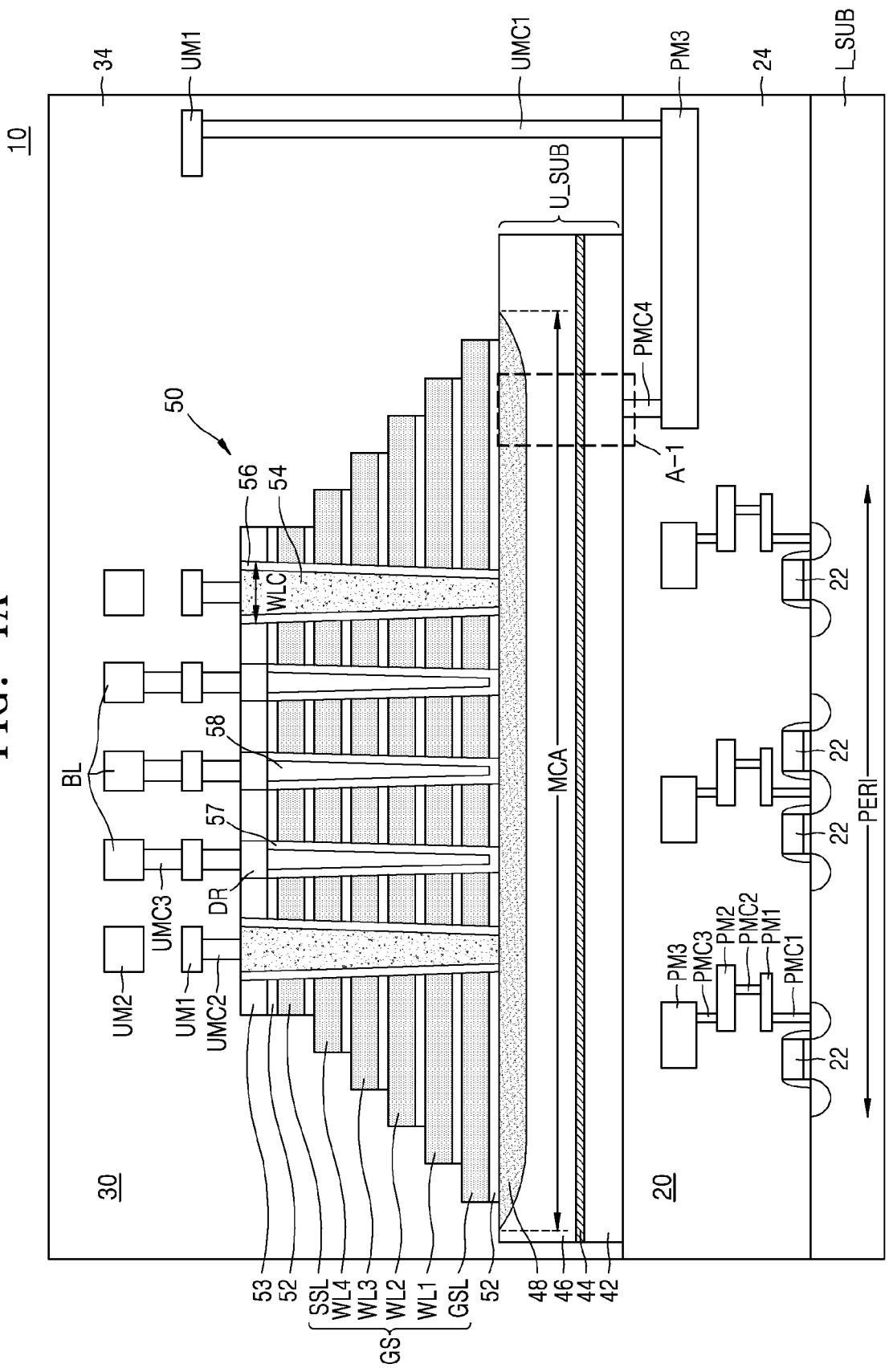
FIG. 4A is a cross-sectional view of a memory device according to some example embodiments of the inventive concepts.
Figure 4B:
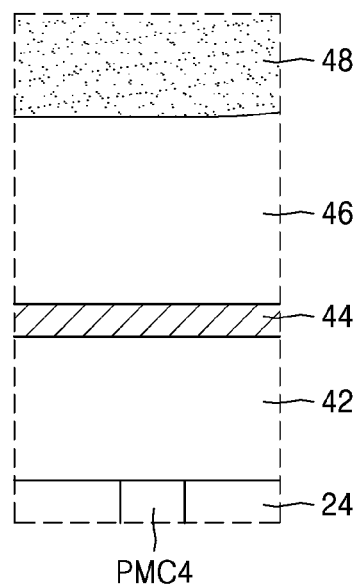
FIG. 4B is an enlarged cross-sectional view of region A-1 of FIG. 4A.

FIG. 4A is a cross-sectional view of a memory device according to some example embodiments of the inventive concepts. FIG. 4B is an enlarged cross-sectional view of region A-1 of FIG. 4A. As described herein a memory device, including the memory device 10, may be a non-volatile memory device.

Referring to FIGS. 4A and 4B, the memory device 10 may include the first semiconductor layer 20 including a peripheral region PERI and the second semiconductor layer 30 including a memory cell region MCA. Restated, at least a portion of the first semiconductor layer 20 that includes one or more peripheral circuits may be referred to as a peripheral region PERI based on the portion of the first semiconductor layer 20 including the one or more peripheral circuits, and at least a portion of the second semiconductor layer 30 that includes one or more memory cell arrays may be referred to as a memory cell region MCA based on the portion of the second semiconductor layer 30 including the one or more memory cell arrays. The memory device 10 may have a structure in which the second semiconductor layer 30 is stacked on the first semiconductor layer 20. At least a portion of the peripheral region PERI and at least a portion of the memory cell region MCA may overlap each other in a vertical direction, but the inventive concepts is not limited thereto.

The first semiconductor layer 20 may include a lower substrate L_SUB, one or more peripheral transistors 22 disposed on the lower substrate L_SUB, peripheral circuit wires electrically connected to the one or more peripheral transistors 22, and a lower insulation layer 24 covering the peripheral circuit wires. The one or more peripheral transistors 22 and/or the one or more peripheral circuit wires may at least partially comprise one or more peripheral circuits. Restated, the first semiconductor layer 20 may include a peripheral region PERI that includes one or more peripheral transistors 22 on a lower substrate L_SUB. The one or more peripheral circuits, as indicated in FIG. 4A, may be on the lower substrate L_SUB. Restated, the memory device 10 may include a peripheral region PERI on the lower substrate L_SUB, where the peripheral region PERI includes a peripheral circuit (e.g., one or more of peripheral transistors 22) on the lower substrate L_SUB.

The lower substrate L_SUB may include a semiconductor substrate including a semiconductor material, such as monocrystalline silicon or monocrystalline germanium, and may be fabricated from (e.g., may at least partially comprise) a silicon wafer. The peripheral region PERI may be formed in a region on the lower substrate L_SUB. The one of more peripheral transistors 22 may be included in the peripheral region PERI. The one or more peripheral transistors 22 may at least partially comprise, for example, the peripheral circuit 60 of FIG. 1.

The peripheral circuit wires may include, for example, a first peripheral conductive line PM1, a second peripheral conductive line PM2, and a third peripheral conductive line PM3 that are sequentially stacked on the lower substrate L_SUB. Furthermore, the peripheral circuit wires may further include a first peripheral contact line PMC1 electrically interconnecting the one or more peripheral transistors 22 and the first peripheral conductive line PM1, a second peripheral contact PMC2 electrically interconnecting the first peripheral conductive line PM1 and the second peripheral conductive line PM2, and a third peripheral contact PMC3 electrically interconnecting the second peripheral conductive line PM2 and the third peripheral conductive line PM3.

The peripheral circuit wires may further include a fourth peripheral contact PMC4 electrically interconnecting at least one of the third peripheral conductive lines PM3 and a first upper substrate 42. Restated, the fourth peripheral contact PMC4 may be a contact that is electrically connected to the first upper substrate. As shown in FIGS. 4A and 4B, the contact (PMC4) may be electrically connected to a bottom surface of the first upper substrate 42. In some example embodiments, the contact (PMC4) may be configured to transfer a voltage to the first upper substrate 42 based on an operation signal being applied to the memory cell array 50. For example, according to some example embodiments, based on an operation signal regarding the memory cell array 50 being applied to the memory cell region MCA, the first upper substrate 42 may receive a power supply voltage through the fourth peripheral contact PMC4. The power supply voltage may be, for example, a power supply voltage supplied to the peripheral circuit 60 of FIG. 1 included in the peripheral region PERI. The power supply voltage may be referred to herein as a power supply voltage associated with the peripheral circuit 60. Furthermore, a ground voltage may be applied to the second upper substrate 46. Restated, the memory device 10 may be configured to apply a power supply voltage associated with the peripheral circuit 60 to the first upper substrate 42 based on an operation signal associated with an operation of the memory cell array 50 being applied to the memory cell region MCA.

According to some example embodiments, based on an operation signal regarding the memory cell array 50 being applied to the memory cell region MCA, the first upper substrate 42 may be configured to receive a ground voltage through the fourth peripheral contact PMC4. According to some example embodiments, it is described that there are three types of peripheral conductive lines and four types of peripheral contacts, but the inventive concepts is not limited thereto.

The second semiconductor layer 30 may include an upper substrate U_SUB, a memory cell array 50 on the upper substrate U_SUB, and an upper insulation layer 34 that may cover the memory cell array 50 and the upper substrate U_SUB. As referred to herein, an element that "covers" another element will be understood to encapsulate the other element from exposure to an external environment. Furthermore, the second semiconductor layer 30 may further include upper wires electrically interconnecting the memory cell array 50 and peripheral circuit wires.

The upper substrate U_SUB may be between the peripheral region PERI and the memory cell array 50. Restated, the upper substrate U_SUB may be between the peripheral region PERI and the memory cell region MCA. The upper substrate U_SUB may be a supporting layer that supports the memory cell array 50. The upper substrate U_SUB may also be referred to as a base substrate, for example.

As shown in FIG. 4A, in some example embodiments, the memory device 10 includes a memory cell region MCA on the peripheral region PERI, where the memory cell region MCA includes an upper substrate U_SUB and the memory cell region MCA further includes a memory cell array 50 on the upper substrate U_SUB.

The upper substrate U_SUB may be divided into ("may include") a plurality of layers. According to some example embodiments, the upper substrate U_SUB may include a first upper substrate 42 (e.g., a first upper substrate 42 on the peripheral region PERI), a first layer 44 on the first upper substrate 42, and a second upper substrate 46 on the first layer 44. In other words, the upper substrate U_SUB may include first and second upper substrates 42 and 46 apart from each other with the first layer 44 between the first and second upper substrates 42 and 46.

For example, the first upper substrate 42 may be a poly-silicon layer doped with a first conductivity type (e.g., p-type) impurity (e.g., an impurity of a first conductivity type). Furthermore, the second upper substrate 46 may be a poly-silicon layer doped with an impurity of the same first conductivity type as the first upper substrate 42. The impurities of the first conductivity type with which the first upper substrate 42 and the second upper substrate 46 are doped may be the same impurity. The first layer 44 may be doped with a second conductivity type (e.g., n-type) impurity, where the second conductivity type is opposite to the first conductivity type.

The first and second upper substrates 42 and 46 may include bulk silicon substrates, silicon-on-insulator (SOI) substrates, germanium substrates, germanium-on-insulator (GOI) substrates, silicon-germanium substrates, or epitaxial thin-film substrates obtained by performing selective epitaxial growth (SEG). The first and second upper substrates 42 and 46 may include a semiconductor material. For example, the first and second upper substrates 42 and 46 may include at least one of silicon (Si), germanium (Ge), silicon germanium (SiGe), gallium arsenide (GaAs), indium gallium arsenide (InGaAs), aluminum gallium arsenide (AlGaAs), or a combination thereof.

The first layer 44 may be between the first and second upper substrates 42 and 46. The first layer 44 may include a silicon oxide, a silicon nitride, a silicon oxynitride, a gallium oxide, a germanium oxide, a high-k dielectric material, or a combination thereof.

According to some example embodiments, the first layer 44 may be between first and second upper substrates 42 and 46 and c a dielectric layer. In this case, the first and second upper substrates 42 and 46 and the first layer 44 may constitute a capacitor. In other words, the first upper substrate 42 may constitute a lower electrode of the capacitor, the first layer 44 may constitute a dielectric layer of the capacitor, and the second upper substrate 46 may constitute an upper electrode of the capacitor. Restated further, the first layer 44 may include a dielectric layer, the memory device 10 may further include a capacitor, and the capacitor may include the first upper substrate 42, the second upper substrate 46, and the first layer 44.

A well region 48 may be formed in the second upper substrate 46. The well region 48 may be an n-type well formed by doping a portion of the second upper substrate 46 with a second conductivity type (e.g., n-type) impurity (e.g., an impurity of a second conductivity type). However, the inventive concepts are not limited thereto, and the well region 48 may be a p-type well doped with a first conductivity type impurity. Furthermore, the well region 48 may be formed by overlapping a first conductivity type well and a second conductivity type well to each other.

According to some example embodiments, the memory cell region MCA may be defined as a region (a "limited portion" or an "entire portion") of the well region 48. The memory cell region MCA may be a region of the well region 48 on which a memory cell array 50 including vertical stacked memory cells is disposed. In other words, a plurality of channel layers and gate conductive layers GS may be disposed on the well region 48 and constitute the memory cell array 50. As shown in FIG. 4A, the plurality of gate conductive layer GS may be on the second upper substrate 46.

The memory cell array 50 may include the gate conductive layers GS stacked on the well region 48. The gate conductive layers GS may include a ground select line GSL, word lines WL1 through WL4, and a string select line SSL. The ground select line GSL, the word lines WL1 through WL4, and the string select line SSL may be sequentially stacked on the well region 48, and an insulation layer 52 may be disposed below or above each of the gate conductive layers GS. The gate conductive layers GS can be reduced in area as the distance from the well region 48 is increased.

According to some example embodiments, it is simply shown that four word lines are formed. In some example embodiments, a different number of word lines may be stacked between the ground select line GSL and the string select line SSL in a vertical direction with the insulation layers 52 are between the adjacent word lines. Furthermore, two or more ground select lines GSL and two or more string select lines SSL may also be stacked in a vertical direction.

Meanwhile, the gate conductive layers GS may be separated by word line cut regions WLC. A common source plug 54 extending from a main surface of the well region 48 in a vertical direction may be formed in a word line cut region WLC. The common source plug 54 may be electrically connected to the well region 48. For example, the common source plug 54 may include at least one metal selected from among tungsten (W), aluminum (Al), and copper (Cu).

Spacers 56 including an insulation material may be disposed on two opposite sidewalls of the common source plug 54, thereby preventing an electrical connection between the common source plug 54 and the gate conductive layers GS. For example, the spacers 56 may include a silicon oxide, a silicon nitride, or a silicon oxynitride.

Channel layers 57 may penetrate through the gate conductive layers GS and the insulation layers 52 and may extend in a direction perpendicular to the top surface of the well region 48, and bottom surfaces of the channel layers 57 may contact the top surface of the well region 48. The channel layers 57 may be arranged a certain distance apart from one another between the word line cut regions WLC. The channel layers 57 may be understood to extend in a direction perpendicular to a top surface of the second upper substrate 46, for example as shown in FIG. 4A.

A channel layer 57 may include an impurity-doped poly-silicon or a poly-silicon that is not doped with an impurity. The channel layer 57 may be have a vertically extending cup-like shape (or a bottomed cylinder-like shape), and a buried insulation layer 58 may be disposed on the inner sidewall of the channel layer 57 to fill the channel layer 57. The buried insulation layer 58 may include an insulating material, such as silicon oxide, or an air gap. In another example, the channel layer 57 may be have a pillar-like shape, in which case the buried insulation layer 58 may not be formed.

A portion of the channel layer 57 adjacent to the ground select line GSL and the ground select line GSL may constitute the ground select transistor (FIG. 3). Furthermore, the word lines WL1 through WL4 and portions of the channel layer 57 adjacent to the word lines WL1 through WL4 may constitute the memory cell transistors MC1 through MC8 (FIG. 3). Furthermore, the string select line SSL and a portion of the channel layer 57 adjacent to the string select line SSL may constitute the string selection transistor SST (FIG. 3).

A drain region DR may be formed on the channel layer 57 and the buried insulation layer 58. For example, the drain region DR may include impurity-doped poly-silicon. The drain region DR may also be referred to as a channel pad. The drain region DR may be electrically connected to the bit line BL through a second contact UMC2, a first conductive line UM1, and a third contact UMC3.

An etch stop layer 53 may be disposed on sidewalls of the drain region DR. The top surface of the etch stop layer 53 may be disposed on a same level as the top surface of the drain region DR. The etch stop layer 53 may include an insulating material, such as a silicon nitride or a silicon oxide.

Upper wires may include, for example, the first conductive line UM1 and a second conductive line UM2 that are sequentially stacked above the top surface of the memory cell array 50 in a vertical direction. The second conductive line UM2 may include the bit line BL. Furthermore, the upper wires may further include a first contact UMC1 electrically interconnecting a third peripheral conductive line PM3 and the first conductive line UM1, the second contact UMC2 electrically interconnecting the memory cell array 50 and the first conductive line UM1, and the third contact UMC3 electrically interconnecting the first conductive line UM1 and the second conductive line UM2. According to some example embodiments, it is described that there are two types of conductive lines and three types of contacts, but the inventive concepts is not limited thereto.

For example, based on an operation signal being applied to the memory cell array 50, a power supply voltage may be applied to the first upper substrate 42. Restated, the memory device 10 may be configured to apply a power supply voltage associated with a peripheral circuit 60 to the first upper substrate 42 based on an operation signal associated with an operation of the memory cell array 50 being applied to the memory cell region MCA. The power supply voltage may be, for example, a power supply voltage supplied to the peripheral circuit 60 (FIG. 1) included in the peripheral region PERI. The first upper substrate 42 may receive the power supply voltage through, for example, the fourth peripheral contact PMC4. Furthermore, a ground voltage may be applied to the second upper substrate 46. Although not shown, the second upper substrate 46 may receive a ground voltage through a contact connected to the top surface of the second upper substrate 46. In some example embodiments, the memory device 10 may be configured to apply a ground voltage to the first upper substrate 42 (e.g., via contact PMC4) based on an operation signal associated with an operation of the memory cell array 50 being applied to the second upper substrate 46. In some example embodiments, the memory device 10 may be configured to apply a voltage to the first layer 44 based on the operation signal associated with the operation of the memory cell array 50 being applied to the second upper substrate 46, where the voltage has a magnitude greater than or equal to a magnitude of the ground voltage.

When the first layer 44 constitutes a dielectric layer, the first and second upper substrates 42 and 46 and the first layer 44 may constitute a capacitor to which the power supply voltage is supplied, suppress noise of the power supply voltage and/or a ripple voltage, and attenuate a voltage fluctuation due to an instantaneous current. In other words, the upper substrate U_SUB may function as a power-capacitor in addition to functioning as the support layer for the memory cell array 50, thereby improving the integration of the memory device 10 and enabling improved performance of the memory device 10, based at least in part upon improved integration and/or improved operational efficiency. In addition, based at least in part upon integration of the memory device 10 being improved, manufacturing efficiency and/or cost with regards to manufacturing the memory device 10 may be improved.

Figure 5A:
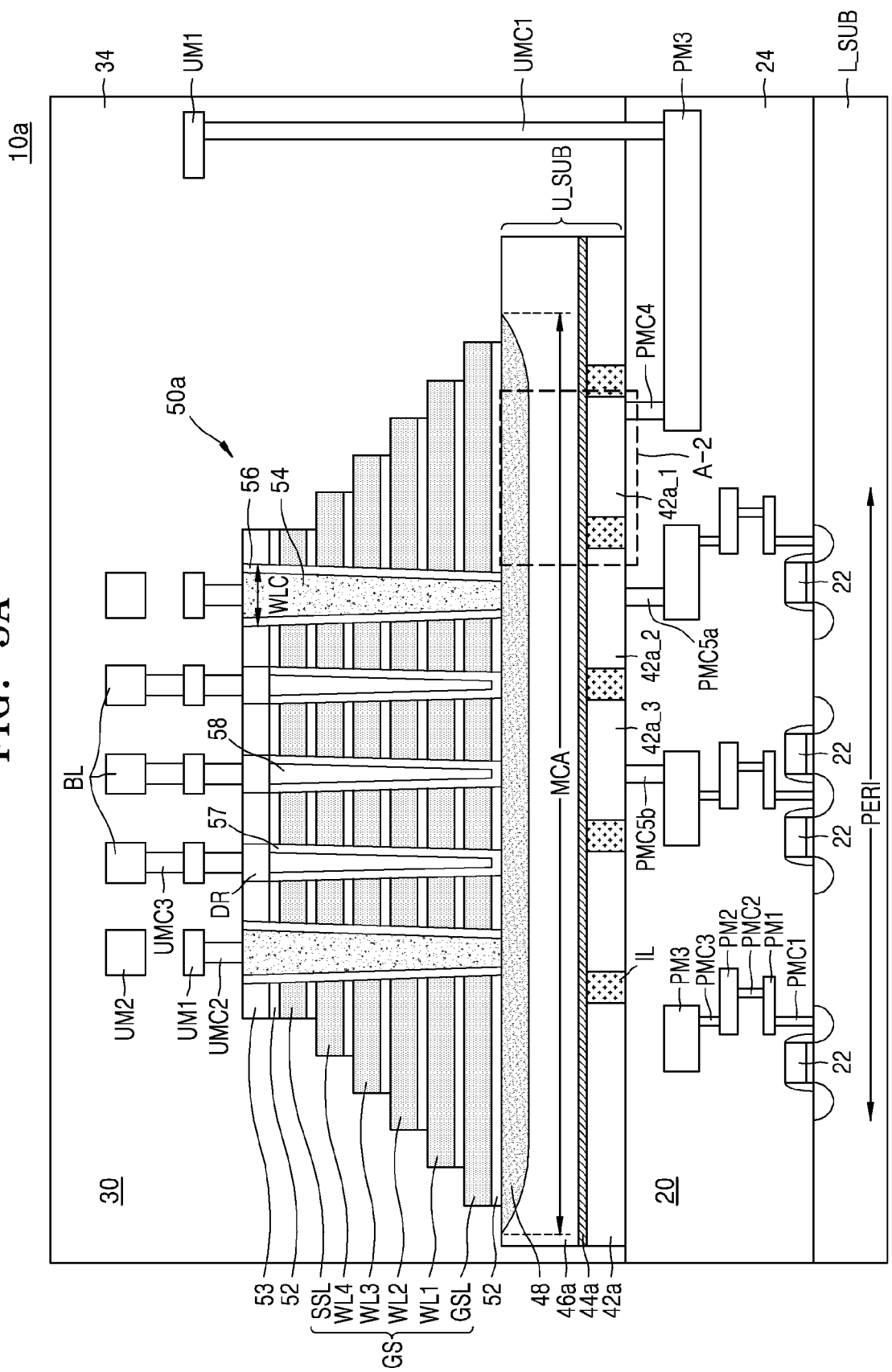
FIG. 5A is a cross-sectional view of a memory device according to some example embodiments of the inventive concepts.
Figure 5B:
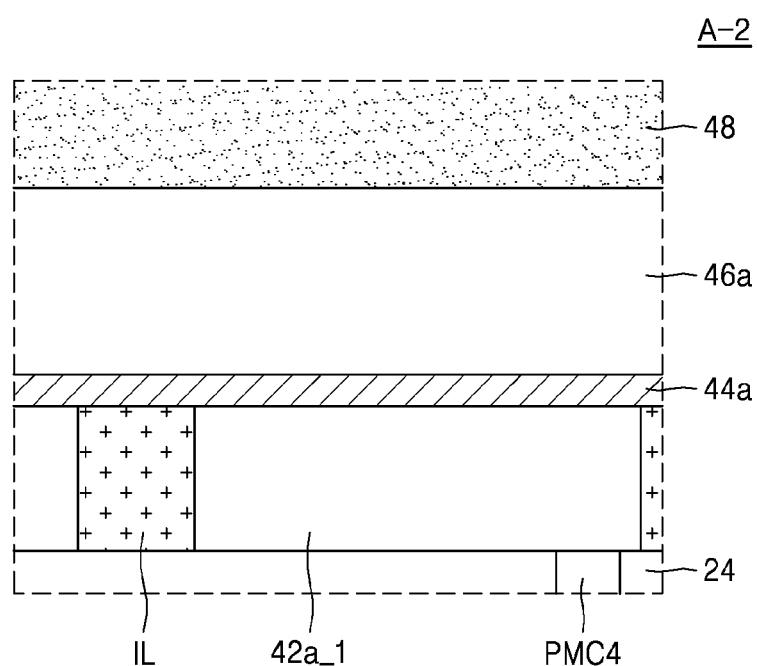
FIG. 5B is an enlarged cross-sectional view of region A-2 of FIG. 5A.

FIG. 5A is a cross-sectional view of a memory device 10a according to some example embodiments of the inventive concepts. FIG. 5B is an enlarged cross-sectional view of region A-2 of FIG. 5A. Descriptions of components shown in FIG. 5A identical to those given above with reference to FIG. 4A will be omitted.

Referring to FIGS. 5A and 5B, the upper substrate U_SUB may include a first upper substrate 42a, a first layer 44a, and a second upper substrate 46a, and the first upper substrate 42a may include one or more insulation layers IL. The insulation layers IL may include an insulating material, e.g., a silicon oxide.

According to some example embodiments, the first upper substrate 42a may be separated into a plurality of sections by the one or more insulation layers IL. The plurality of sections separated by the insulation layers IL may include, for example, a first section 42a_1, a second section 42a_2, and a third section 42a_3.

According to some example embodiments, different types of power supply voltages may be applied to the first through third sections 42a_1 through 42a_3. The different types of power supply voltages may refer to, for example, power supply voltages having different levels ("magnitudes"). Each of the different types of power supply voltages may be, for example, a power supply voltage supplied to the peripheral circuit 60 (FIG. 1) included in the peripheral region PERI. As shown in FIG. 5A, for example, different contacts (e.g., a first contact PMC4, a second contact PMC5a, and a third contact PMC5b) may be electrically connected to the first section 42a_1, the second section 42a_2, and the third section 42a_3, respectively.

For example, when ("based on") the memory cell array 50a performs first through third operations different from one another, a power supply voltage of a first level may be applied to the first section 42a_1 during a first operation. A power supply voltage of a second level may be applied to the second section 42a_2 during a second operation, and a power supply voltage of a third level may be applied to the third section 42a_3 during a third operation. For example, the first through third sections 42a_1 through 42a_3 may receive different types of power supply voltages through fourth contacts PMC4 different from one another, respectively. According to some example embodiments, for convenience of explanation, only three sections including the first through third sections 42a_1 through 42a_3 have been described, but the inventive concepts are not limited thereto.

For example, the first contact PMC4 may be configured to transfer a first voltage to the first section 42a_1 based on a first operation signal associated with a first operation of the memory cell array 50 being applied to the memory cell array 50, and the second contact PMC5a may be configured to transfer a second voltage to the second section 42a_2 based on a second operation signal associated with a second operation of the memory cell array 50 being applied to the memory cell array 50, where the second voltage has a different magnitude than a magnitude of the first voltage.

Figure 6A:
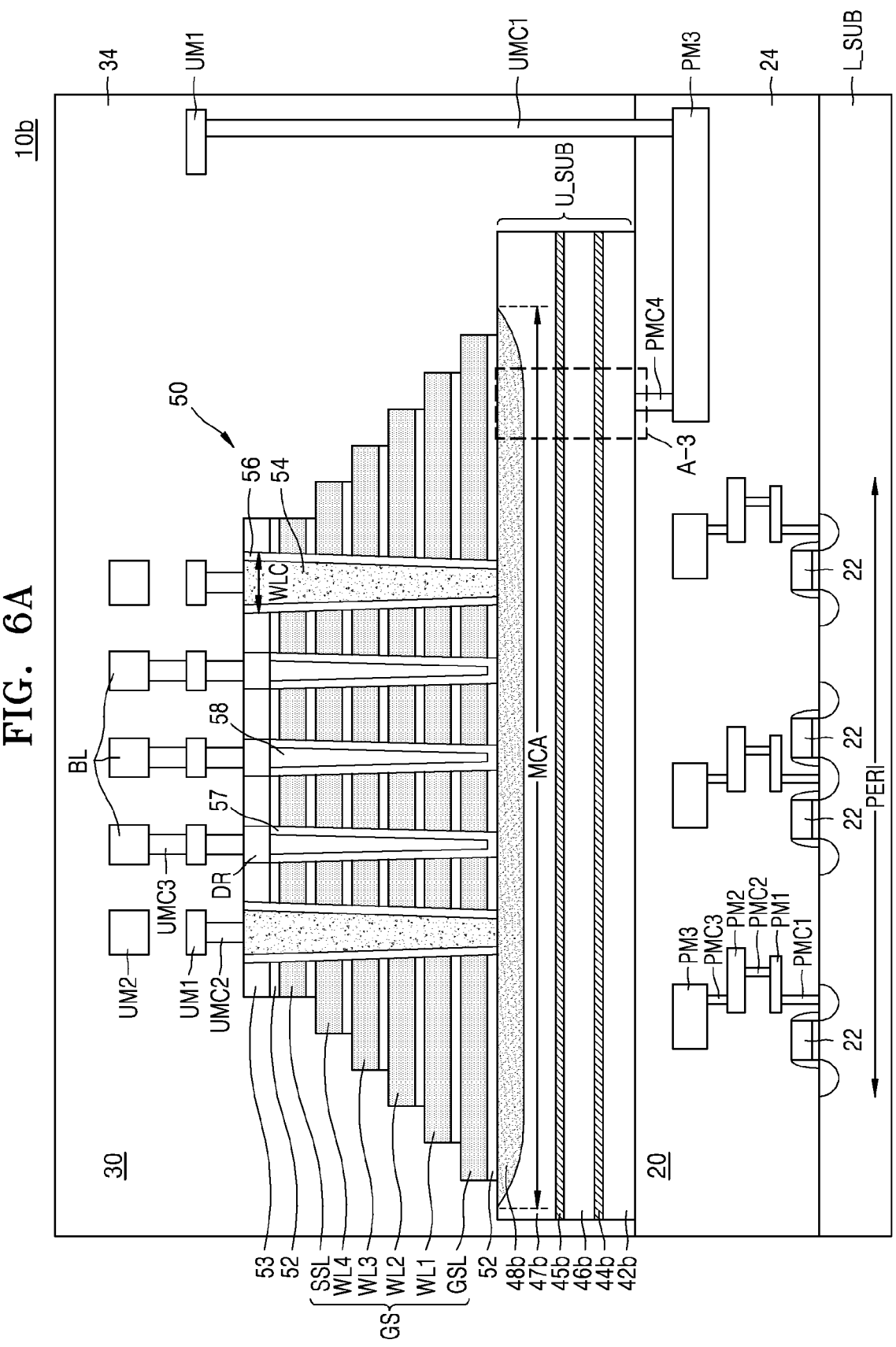
FIG. 6A is a cross-sectional view of a memory device according to some example embodiments of the inventive concepts.
Figure 6B:
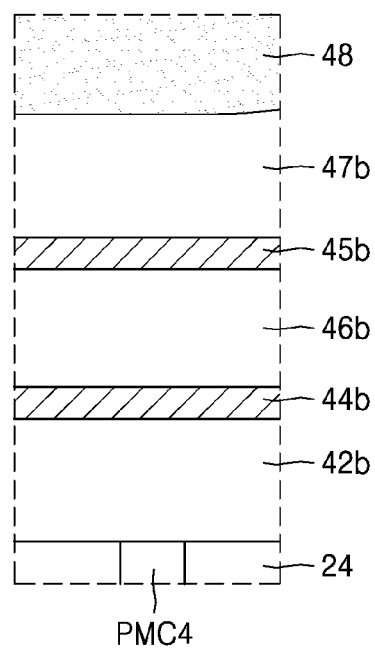
FIG. 6B is an enlarged cross-sectional view of region A-3 of FIG. 6A.

FIG. 6A is a cross-sectional view of a memory device 10b according to some example embodiments of the inventive concepts. FIG. 6B is an enlarged cross-sectional view of region A-3 of FIG. 6A. Descriptions of components shown in FIG. 6A identical to those given above with reference to FIG. 4A will be omitted.

Referring to FIGS. 6A and 6B, an upper substrate U_SUB may include a first upper substrate 42b, a second upper substrate 46b, a third upper substrate 47b, a first layer 44b, and a second layer 45b. According to some example embodiments, the first layer 44b may be on the first upper substrate 42b, the second upper substrate 46b may be on the first layer 44b, the second layer 45b may be on the second upper substrate 46b, and the third upper substrate 47b may be on the second layer 45b. In other words, a plurality of layers, that is, the first and second layers 44b and 45b and the second upper substrate 46b may be between the first upper substrate 42b and the third upper substrate 47b. According to some example embodiments, a well region 48b may be formed on the third upper substrate 47b.

For example, the first through third upper substrates 42b, 46b, and 47b may be poly-silicon layers doped with one or more impurities of a same conductivity type (e.g., a first conductivity type). The first layer 44b may be between the first upper substrate 42b and the second upper substrate 46b and constitute a dielectric layer. Furthermore, the second layer 45b may be between the second upper substrate 46b and the third upper substrate 47b and constitute a dielectric layer. Therefore, the first upper substrate 42b, the first layer 44b, and the second upper substrate 46b may constitute a capacitor (e.g., the memory device 10b may include a capacitor, where the capacitor including the first upper substrate 42b, the second upper substrate 46b, and the first layer 44b. In other words, the first upper substrate 42b may constitute a lower electrode of the capacitor, the first layer 44b may constitute a dielectric layer of the capacitor, and the second upper substrate 46b may constitute an upper electrode of the capacitor. The second layer 45b may include poly-silicon doped with an impurity of a second conductivity type, where the second conductivity type opposite to the first conductivity type of the one or more impurities with which the first through third upper substrates 42b, 46b, and 47b are doped.

Furthermore, the second upper substrate 46b, the second layer 45b, and the third upper substrate 47b may constitute a capacitor. In other words, the second upper substrate 46b may constitute a lower electrode of the capacitor, the second layer 45b may constitute a dielectric layer of the capacitor, and the third upper substrate 47b may constitute an upper electrode of the capacitor.

Figure 7:
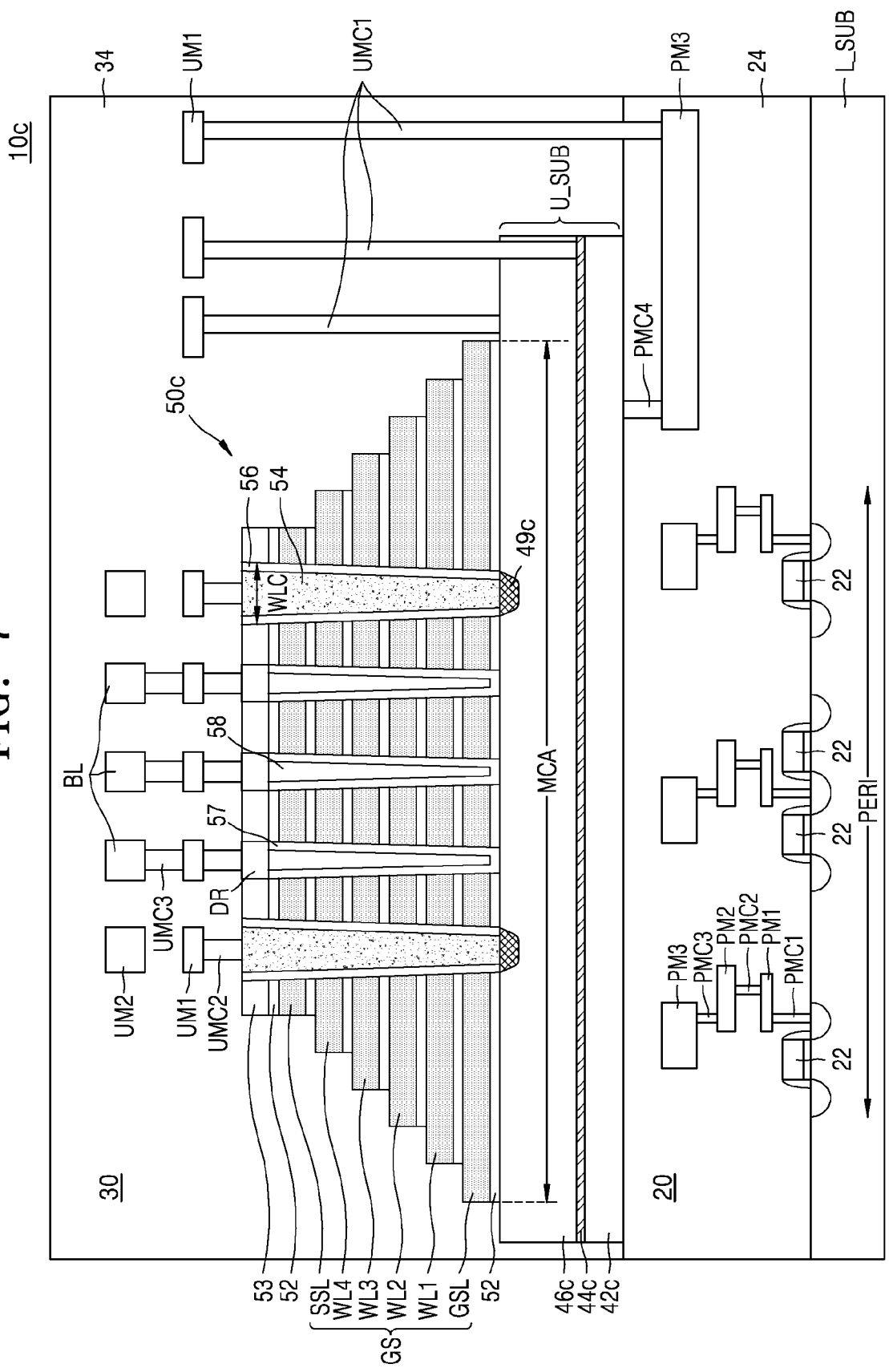
FIG. 7 is a cross-sectional view of a memory device according to some example embodiments of the inventive concepts.

FIG. 7 is a cross-sectional view of a memory device 10c according to some example embodiments of the inventive concepts. Descriptions of components shown in FIG. 7A identical to those given above with reference to FIG. 4A will be omitted.

Referring to FIG. 7, the upper substrate U_SUB may include a first upper substrate 42c, a first layer 44c on the first upper substrate 42c, and a second upper substrate 46c on the first layer 44c. In other words, the upper substrate U_SUB may include first and second upper substrates 42c and 46c apart from each other and the first layer 44c between the first and second upper substrates 42c and 46c.

According to some example embodiments, the first and second upper substrates 42c and 46c may be poly-silicon layers doped with a first conductivity type (e.g., p-type) impurity, and the first layer 44c may be a poly-silicon layer doped with a second conductivity type (e.g., n-type) impurity. In another example, the first and second upper substrates 42c and 46c may be doped with the second conductivity type (e.g., n-type) impurity and the first layer 44c may be doped with the first conductivity type (e.g., p-type) impurity.

The first layer 44c may include a semiconductor material, e.g., at least one of silicon (Si), germanium (Ge), silicon germanium (SiGe), gallium arsenide (GaAs), indium gallium arsenide (InGaAs), aluminum gallium arsenide (AlGaAs), and a combination thereof. The first layer 44c may be disposed through a chemical vapor deposition process, an atomic layer deposition process, a physical vapor deposition process, or the like by using, for example, poly-silicon doped with a second conductivity type (e.g., n-type) impurity. During a process for disposing the first layer 44c, the first layer 44c may be in-situ doped with a second conductivity type impurity. In some example embodiments, after the first layer 44c is disposed, the first layer 44c may be doped with a second conductivity type impurity through an ion implanting operation.

A common source region 49c may be disposed on the second upper substrate 46c. For example, the common source region 49c may be an impurity region densely doped with a second conductivity type (e.g., n-type) impurity. The common source region 49c may be electrically connected to a common source plug 54c. The second upper substrate 46c and the common source region 49c may constitute a p-n junction diode. The common source region 49c may serve as a source region for supplying a current to memory cells included in a memory cell array 50c.

According to some example embodiments, the memory cell region MCA may be a region on the second upper substrate 46c where the memory cell array 50c including vertical stacked memory cells is disposed. According to some example embodiments, the first contact UMC1 of upper wires may electrically interconnect the first conductive line UM1 and the third peripheral conductive line PM3, the first conductive line UM1 and the first layer 44c, or the first conductive line UM1 and the second upper substrate 46c.

According to some example embodiments, when an operation signal is applied to the memory cell array 50c, a ground voltage may be applied to the first upper substrate 42c, a first voltage having a level higher than or equal to that of the ground voltage may be applied to the first layer 44c. Restated, in some example embodiments, the memory device 10c may be configured to apply a ground voltage to the first upper substrate 42c (e.g., via contact PMC4) based on an operation signal associated with an operation of the memory cell array 50c being applied to the second upper substrate 46c, and the memory device 10c may be configured to apply a voltage to the first layer 44c (e.g., via a contact UMC1 that is electrically connected to the first layer 44c as shown in FIG. 7) based on the operation signal associated with the operation of the memory cell array 50c being applied to the second upper substrate 46c, where the voltage has a magnitude greater than or equal to a magnitude of the ground voltage. Furthermore, various operation signals having various levels ("magnitudes") may be applied to the second upper substrate 46c. According to some example embodiments, the first voltage may have a same level as operation signals applied to the second upper substrate 46c.

The first upper substrate 42c may receive a ground voltage through the fourth peripheral contact PMC4. Furthermore, the first layer 44c may receive the first voltage through the first contact UMC1 connected to the top surface of the first layer 44c. Furthermore, the second upper substrate 46c may receive various operation signals having various levels through the first contact UMC1 connected to the top surface of the second upper substrate 46c.

For example, an erase voltage may be applied to the first layer 44c and the second upper substrate 46c through the first contact UMC1 respectively connected to the top surfaces of the first layer 44c and the second upper substrate 46c and a ground voltage or a voltage close to the ground voltage may be applied to the gate conductive layers GS, thereby implementing a block-by-block erase operation for blocks included in the memory cell array 50c. In this case, the first upper substrate 42c may receive the ground voltage through the fourth peripheral contact PMC4.

According to some example embodiments, when an operation signal is applied to the second upper substrate 46c, the first upper substrate 42c may be in a grounded state and the first upper substrate 42c and the first layer 44c may constitute a p-n junction diode with a reverse bias. Therefore, the first upper substrate 42c and the first layer 44c may block electrical interference, such as crosstalk, in the second upper substrate 46c generated by the third peripheral conductive line PM3. As a result, electrical stability of a memory device, and thus performance of the memory device, may be improved by less deteriorating electrical properties due to unnecessary couplings.

Figure 8:
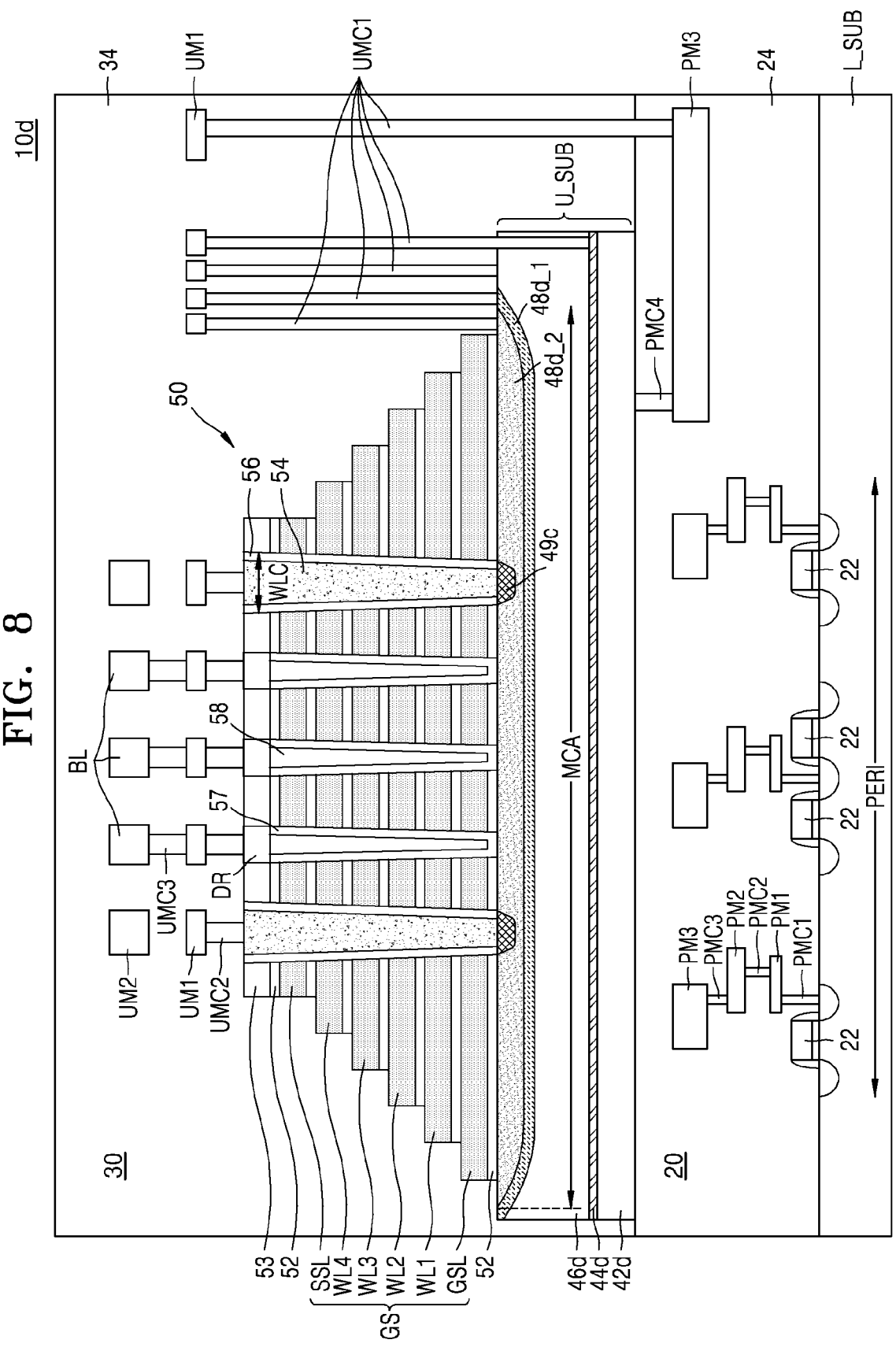
FIG. 8 is a cross-sectional view of a memory device according to some example embodiments of the inventive concepts.

FIG. 8 is a cross-sectional view of a memory device 10d according to some example embodiments of the inventive concepts. Descriptions of components shown in FIG. 8 identical to those given above with reference to FIGS. 4A and 7 will be omitted.

Referring to FIG. 8, the upper substrate U_SUB may include a first upper substrate 42d, a first layer 44d stacked on the first upper substrate 42d, and a second upper substrate 46d stacked on the first layer 44d. According to some example embodiments, the first and second upper substrates 42d and 46d may be poly-silicon layers doped with a first conductivity type (e.g., p-type) impurity, and the first layer 44d may be a poly-silicon layer doped with a second conductivity type (e.g., a n-type) impurity.

A first well region 48d_1 and a second well region 48d_2 may be formed on the second upper substrate 46d. According to some example embodiments, the first well region 48d_1 may be formed by doping a portion of the second upper substrate 46d with a second conductivity type (e.g., n-type) impurity, and the second well region 48d_2 may be formed by doping a portion of the first well region 48d_1 with a first conductivity type (e.g., p-type) impurity. The first well region 48d_1 may have a well structure that surrounds the second well region 48d_2, such that the first well region 48d_1 occupies a portion of the second upper substrate 46d and the second well region 48d_2 occupies a portion of the first well region 48d_1. For example, the second well region 48d_2 may be referred to as a pocket well, whereas the first well region 48d_1 may be referred to as a deep well surrounding a pocket well According to some example embodiments, the memory cell region MCA may be defined as a region of the second well region 48d_2.

The first well region 48d_1 may electrically and spatially separate the second well region 48d_2 from the second upper substrate 46d. For example, when an operation signal is applied to the second well region 48d_2, a ground voltage may be applied to the second upper substrate 46d, and a first voltage having a level higher than or equal to the ground voltage may be applied to the first well region 48d_1. According to some example embodiments, the first voltage may have a same level ("magnitude") as operation signals applied to the second well region 48d_2.

For example, the first well region 48d_1 may receive the first voltage through the first contact UMC1 connected to the top surface of the first well region 48d_1. Furthermore, the second well region 48d_2 may receive operation signals through the first contact UMC1 connected to the top surface of the second well region 48d_2. Although not shown, the first well region 48d_1 and the second well region 48d_2 may each include a junction region for electrical connection with the first contact UMC1. For example, the junction region may have a higher doping concentration than that of each well region.

Figure 9:
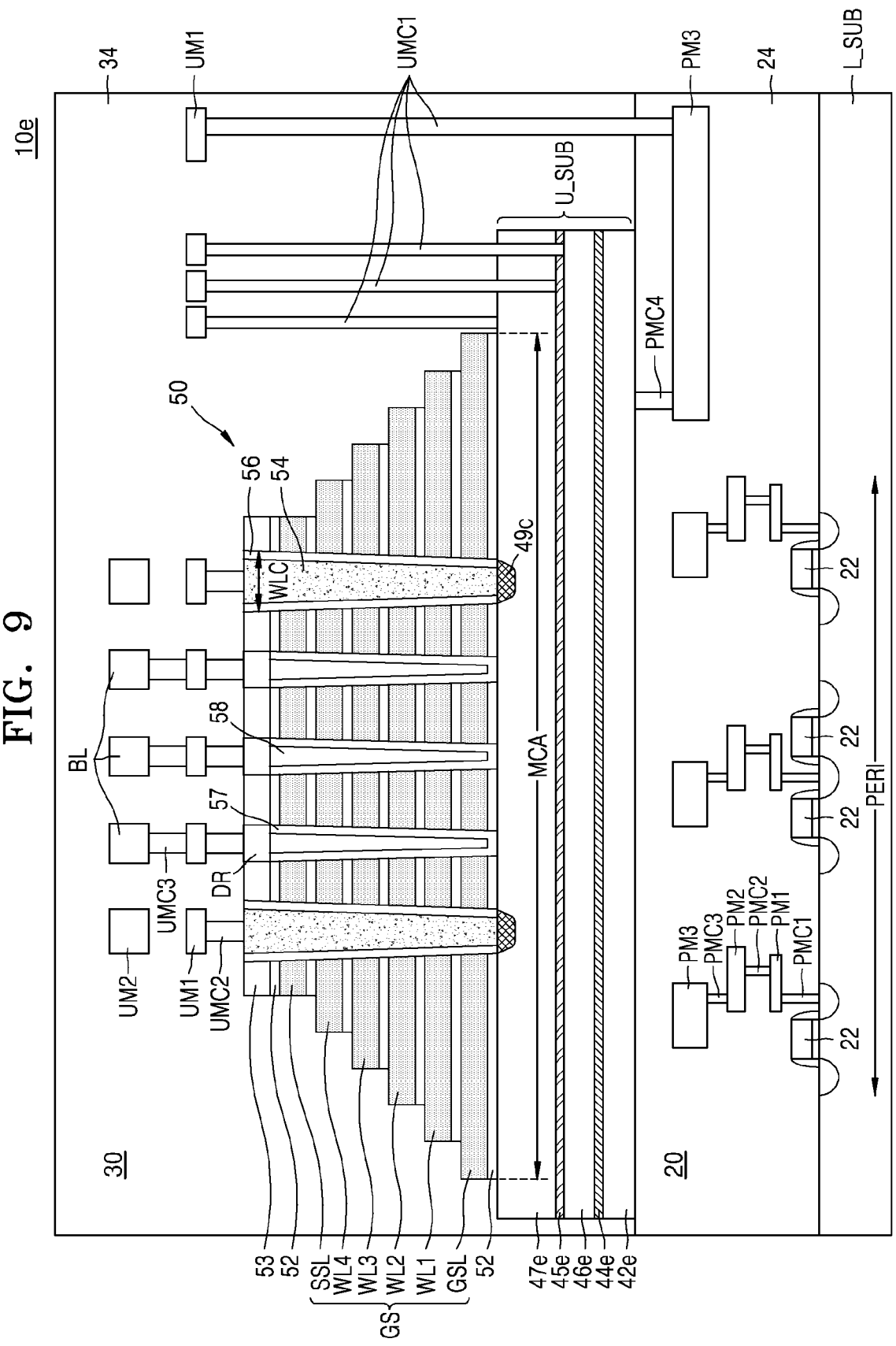
FIG. 9 is a cross-sectional view of a memory device according to some example embodiments of the inventive concepts.

FIG. 9 is a cross-sectional view of a memory device 10e according to some example embodiments of the inventive concepts. Descriptions of components shown in FIG. 9 identical to those given above with reference to FIGS. 4A and 6A will be omitted.

Referring to FIG. 9, an upper substrate U_SUB may include a first upper substrate 42e, a second upper substrate 46e, a third upper substrate 47e, a first layer 44e, and a second layer 45e. According to some example embodiments, the first layer 44e may be stacked the first upper substrate 42e, the second upper substrate 46e may be on the first layer 44e, the second layer 45e may be on the second upper substrate 46e, and the third upper substrate 47e may be on the second layer 45e. According to some example embodiments, the memory cell region MCA may be a region on the second upper substrate 46e where the memory cell array 50e including vertical stacked memory cells is disposed.

According to some example embodiments, the first through third upper substrates 42e, 46e, and 47e may be poly-silicon layers doped with a first conductivity type (e.g., p-type) impurity, and the first layer 44e may be between the first upper substrate 42e and the second upper substrate 46e and may constitute a dielectric layer. Furthermore, the second layer 45e may be a poly-silicon layer doped with a second conductivity type (e.g., n-type) impurity.

Therefore, the first upper substrate 42e, the first layer 44e, and the second upper substrate 46e may constitute a capacitor. In other words, the first upper substrate 42e may constitute a lower electrode of the capacitor, the first layer 44e may constitute a dielectric layer of the capacitor, and the second upper substrate 46e may constitute an upper electrode of the capacitor.

According to some example embodiments, various power supply voltages may be applied to the first upper substrate 42e through the fourth peripheral contact PMC4. Furthermore, a ground voltage may be applied to the second upper substrate 46e through the first contact UMC1 connected to the top surface of the second upper substrate 46e. A first voltage having a level higher than or equal to the ground voltage may be applied to the second layer 45e through the first contact UMC1 connected to the top surface of the second layer 45e. Furthermore, various operation signals having various levels may be applied to the third upper substrate 47e through the first contact UMC1 connected to the top surface of the third upper substrate 47e. According to some example embodiments, the first voltage may have a same level as the various operation signals applied to the third upper substrate 47e.

Restated, in some example embodiments, the memory device 10e includes a contact UMC1, the contact UMC1 penetrating through the second layer 45e and the third upper substrate 47e and extending in a direction perpendicular to a top surface of the second upper substrate 46e, wherein the memory device 10e is configured to apply a ground voltage to the second upper substrate 46e through the contact UMC1 based on an operation signal being applied to the memory cell array 50.

Figure 10:
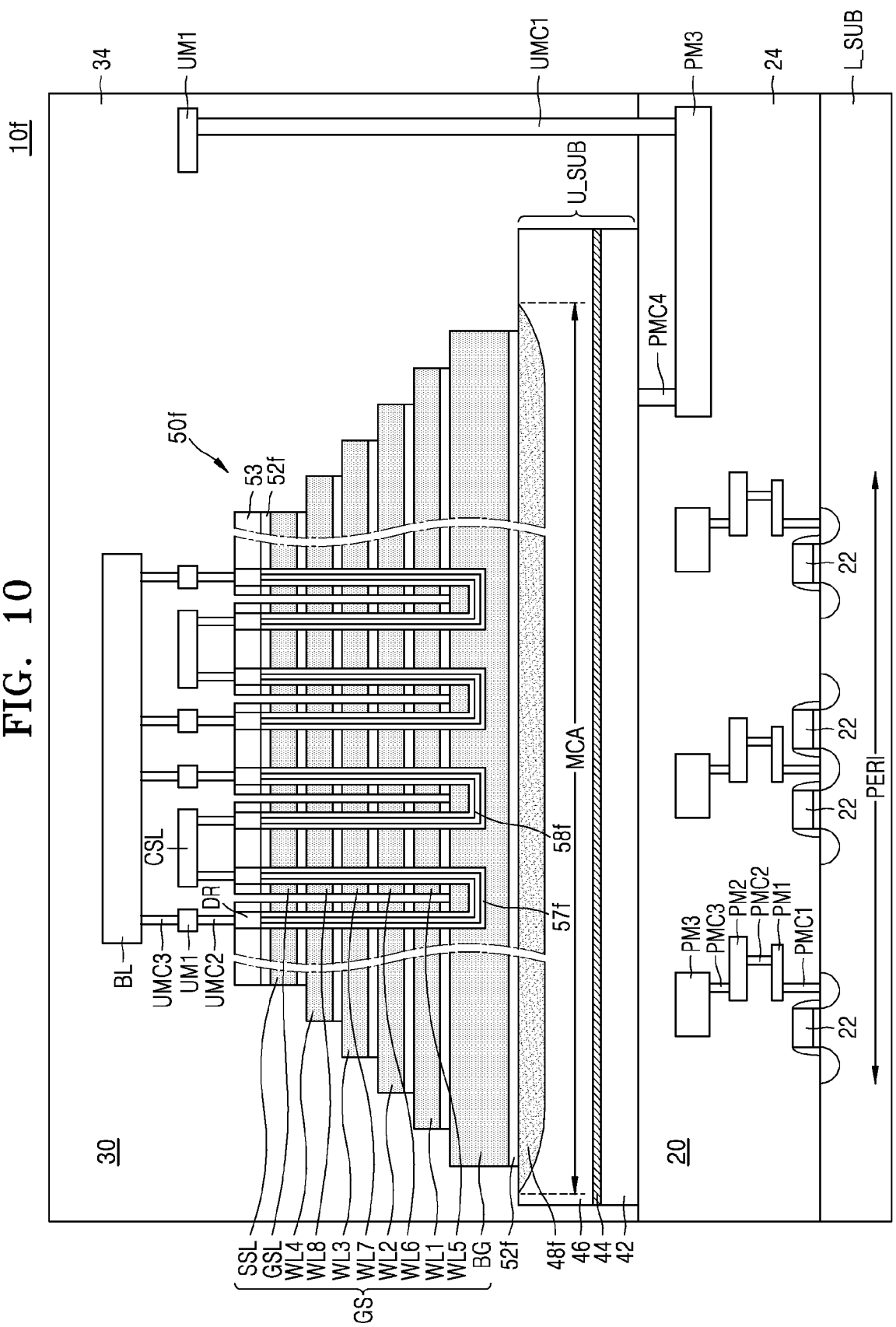
FIG. 10 is a cross-sectional view of a memory device according to some example embodiments of the inventive concepts.

FIG. 10 is a cross-sectional view of a memory device 10f according to some example embodiments of the inventive concepts. Descriptions of components shown in FIG. 9 identical to those given above with reference to FIG. 4A will be omitted.

Referring to FIG. 10, a memory cell array 50f may include gate conductive layers GS stacked on a well region 48f. The gate conductive layers GS may include a back-gate BG, first through eighth word lines WL1 through WL8, the string select line SSL, and the ground select line GSL.

The memory cell array 50f may further include a channel layer 57f and a buried insulation layer 58f that penetrate the gate conductive layers GS in a U shape. First ends of the channel layer 57f and the buried insulation layer 58f having U shapes may be electrically connected to the bit line BL through the drain region DR, the second contact UMC2, the first conductive line UM1, and the third contact UMC3, and second ends of the channel layer 57f and the buried insulation layer 58f having U shapes may be electrically connected to the common source line CSL through the drain region DR and the second contact UMC2.

Specifically, the back-gate BG may be on the well region 48f. An insulation layer 52f may be between the back-gate BG and the well region 48f. Fifth through eighth word lines WL5 through WL8 and the ground select line GSL may be sequentially stacked between the drain region DR connected to the common source line CSL and the back-gate BG. First through fourth word lines WL1 through WL4 and the string select line SSL may be sequentially stacked between the drain region DR connected to the bit line BL and the back-gate BG. For example, one U shaped channel layer 57f and a "U" shaped gate conductive layer GS along the "U" shaped channel layer 57f may constitute a single memory cell string.

FIGS. 11A through 11I are cross-sectional views sequentially showing operations for describing a method of fabricating a memory device, according to some example embodiments of the inventive concepts. The method of fabricating a memory device, according to some example embodiments, may be, for example, a method of fabricating the memory device 10 described above with reference to FIG. 4A.

Figure 11A:
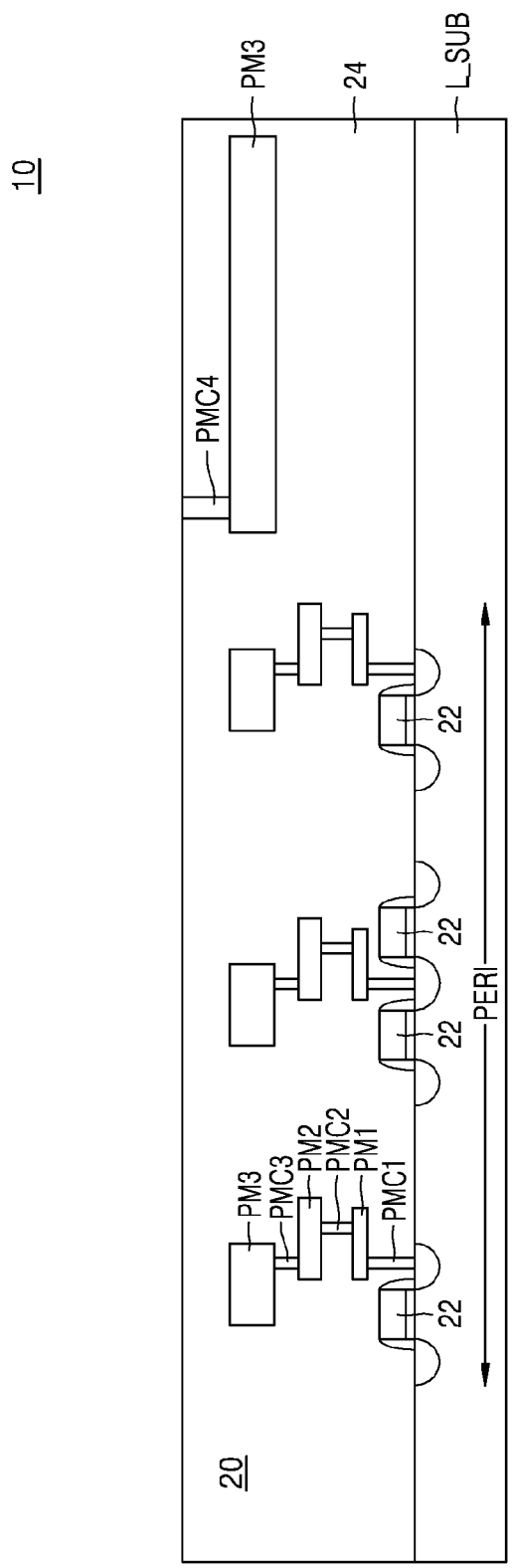
FIGS. 11A through 11I are cross-sectional views sequentially showing operations for describing a method of fabricating a memory device, according to some example embodiments of the inventive concepts.

Referring to FIG. 11A, the peripheral region PERI may be formed in a portion of the lower substrate L_SUB. In the peripheral region PERI, for example, the one or more peripheral transistors 22 may be formed. Although not shown, a p-type well for a peripheral circuit and/or an n-type well for a peripheral circuit may be formed in the lower substrate L_SUB through a plurality of ion implanting operations. For example, the p-type well for a peripheral circuit may be an NMOS transistor-forming region, whereas the n-type well for a peripheral circuit may be a PMOS transistor-forming region.

After the one or more peripheral transistors 22 are formed, peripheral circuit wires including first through fourth peripheral contacts PMC1 through PMC4 and first through third peripheral conductive lines PM1 through PM3 may be formed, and a lower insulation layer 24 capable of insulating the peripheral circuit wires from one another may be formed. According to some example embodiments, the lower insulation layer 24 may include a plurality of interlayer insulating layers and may further include one or more etch stop layers. According to the operation described with reference to FIG. 11A, the first semiconductor layer 20 may be formed.

Figure 11B:
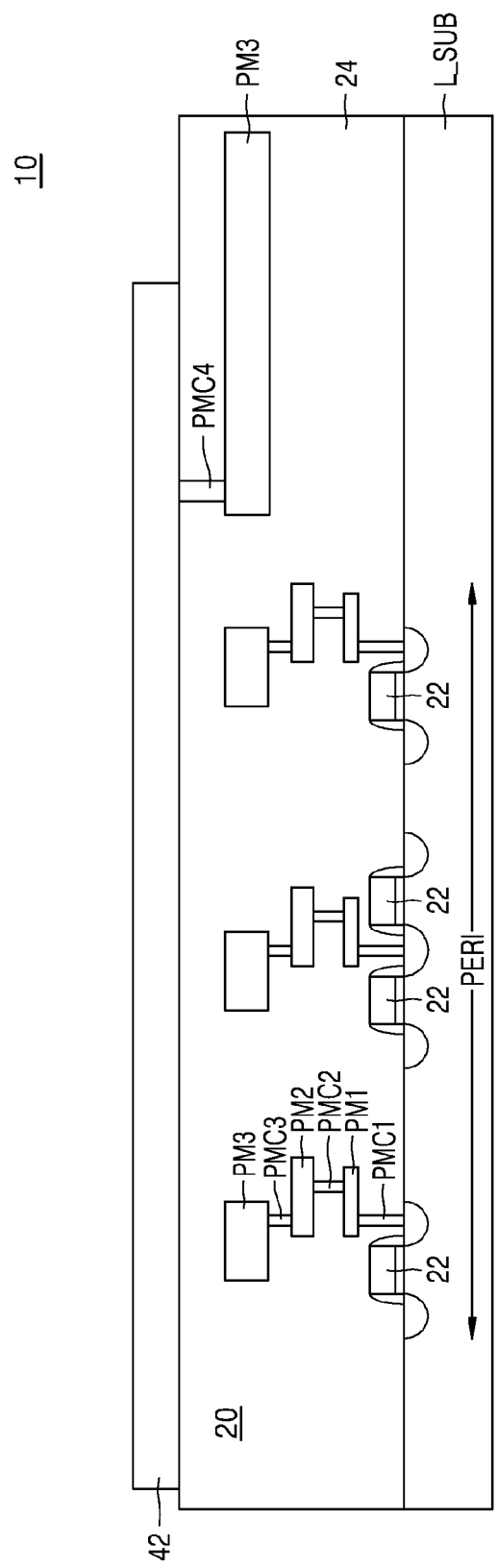

Referring to FIG. 11B, the first upper substrate 42 may be formed on the first semiconductor layer 20. The first upper substrate 42 may be formed by a chemical vapor deposition process, an atomic layer deposition process, a physical vapor deposition process, or the like by using a poly-silicon doped with a first conductivity type (e.g., p-type) impurity. During the operation for forming the first upper substrate 42, the first upper substrate 42 may be in-situ doped with a first conductivity type impurity. In some example embodiments, after the first upper substrate 42 is formed, the first upper substrate 42 may be doped with a first conductivity type impurity through an ion implanting operation.

Figure 11C:
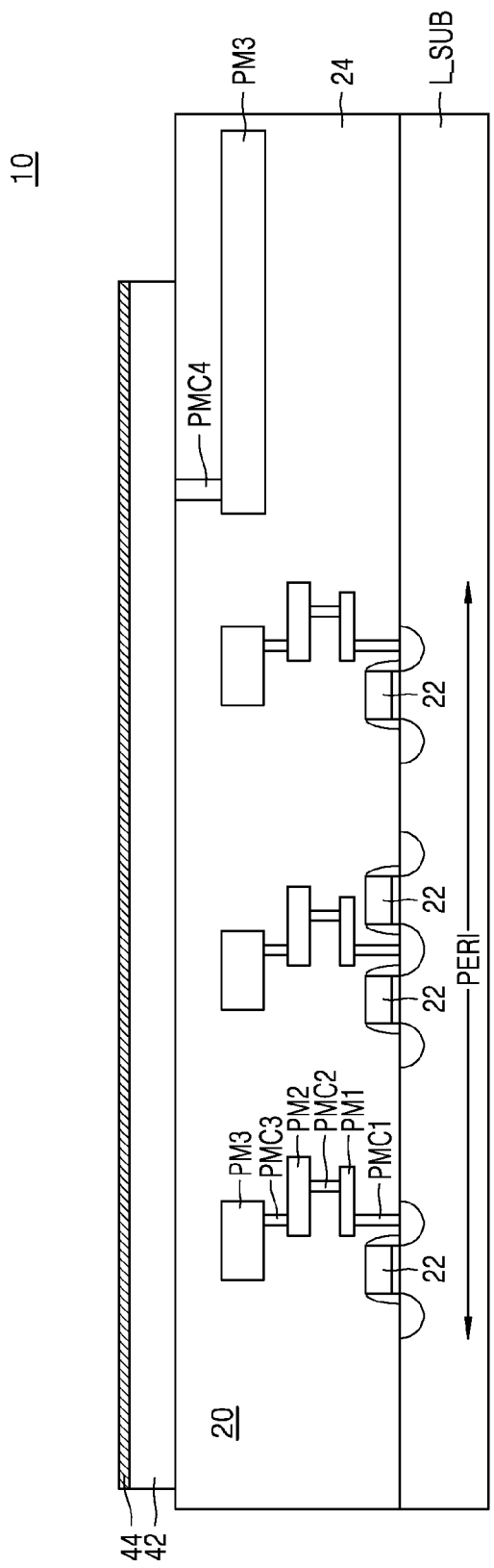

Referring to FIG. 11C, the first layer 44 may be formed on the first upper substrate 42. The first layer 44 may include silicon oxide, silicon nitride, silicon oxynitride, gallium oxide, germanium oxide, a high-k dielectric material, or a combination thereof. According to some example embodiments, the first layer 44 may be a poly-silicon layer doped with a second conductivity type (e.g., n-type) impurity (e.g., a conductivity type that is opposite to the first conductivity type). The doping of the first layer 44 may be performed as part of forming the first layer 44.

Figure 11D:
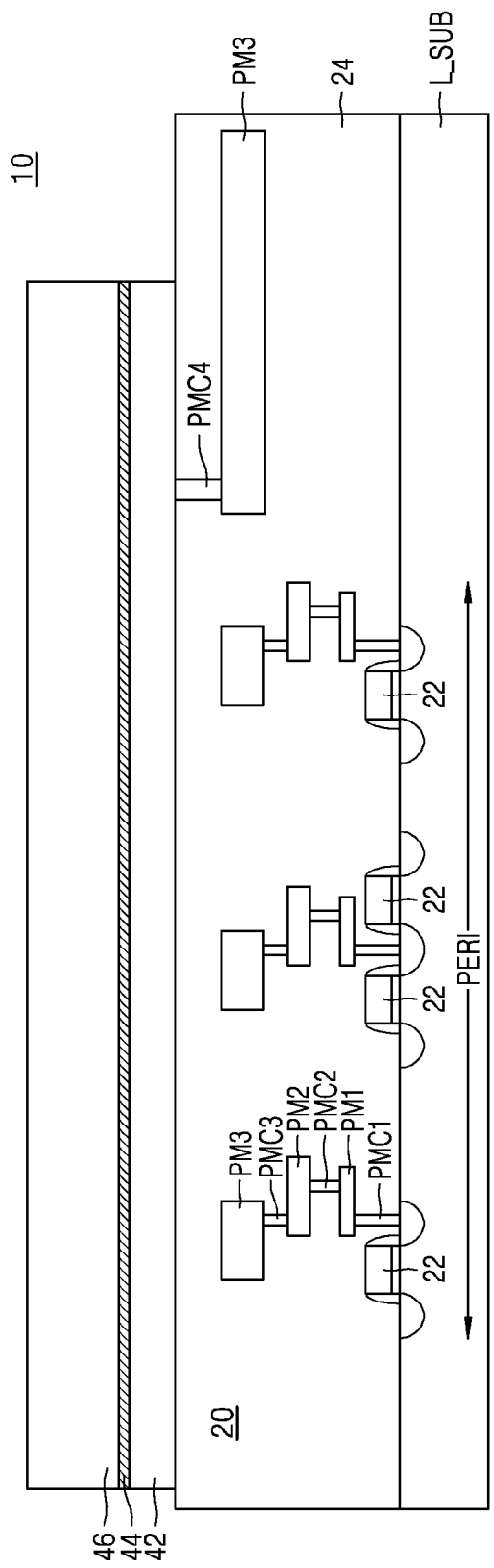

Referring to FIG. 11D, the second upper substrate 46 may be formed on the first layer 44. The second upper substrate 46 may be, for example, a poly-silicon layer doped with a first conductivity type impurity. The second upper substrate 46 may be formed by an operation identical to that for forming the first upper substrate 42.

Figure 11E:
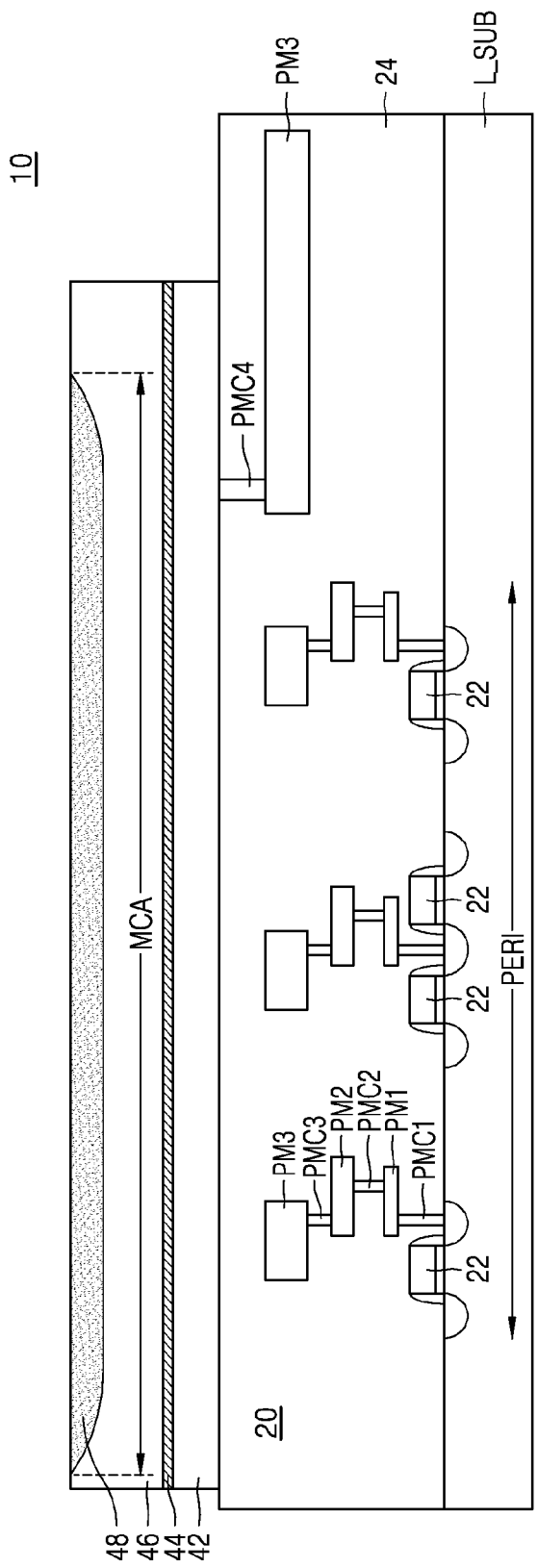

Referring to FIG. 11E, the memory cell region MCA may be formed on the second upper substrate 46. The memory cell region MCA may be formed by forming the well region 48 in a portion of the second upper substrate 46. For example, the well region 48 may be formed by doping a portion of the second upper substrate 46 with a second conductivity type impurity. The second upper substrate 46 may be doped with an impurity through an ion implanting operation.

Figure 11F:
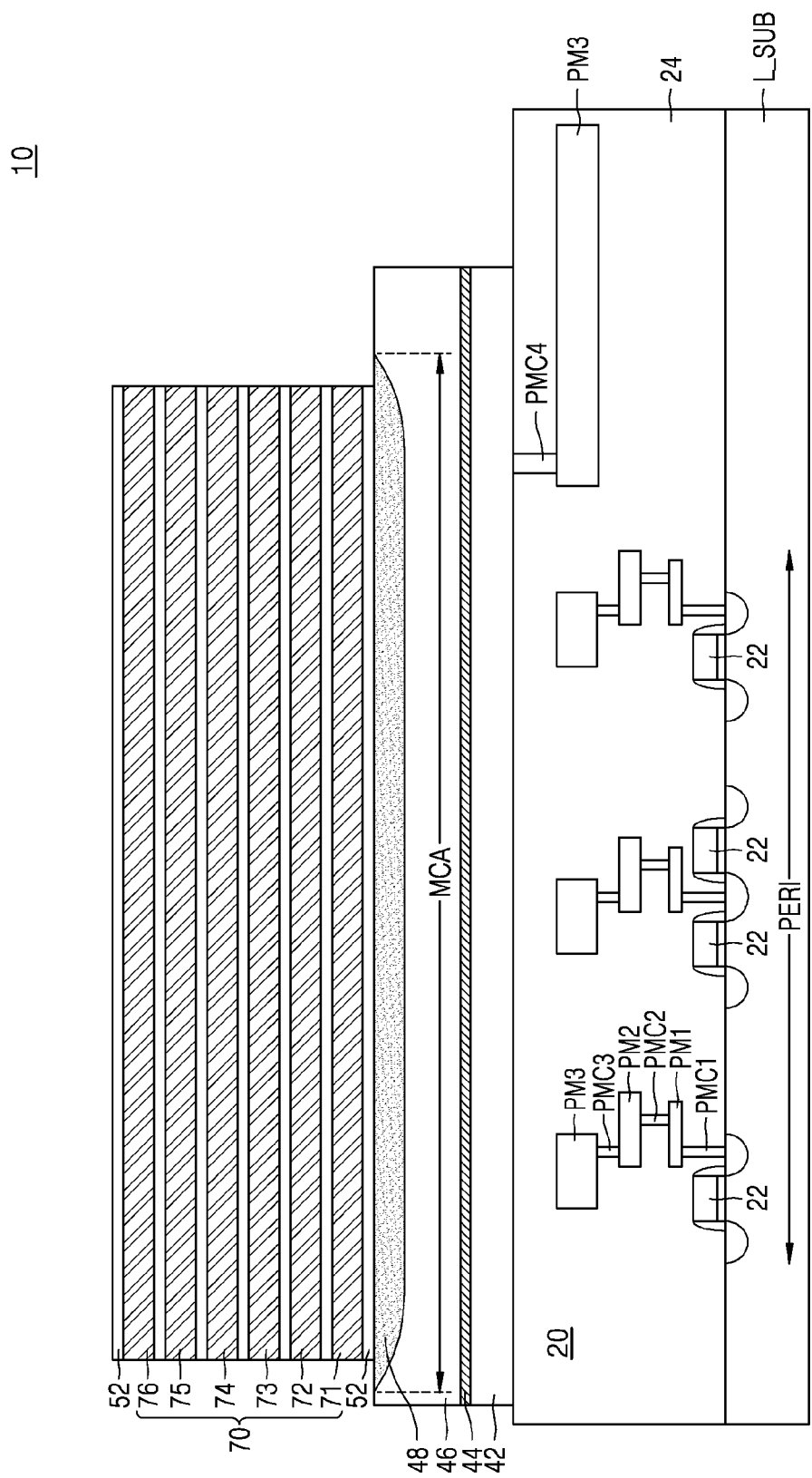

Referring to FIG. 11F, a preparatory gate stack structure 70 may be formed by alternately stacking insulation layers 52 and first through sixth preparatory gate layers 71 through 76 (first preparatory gate layer 71, second preparatory gate layer 72, third preparatory gate layer 73, fourth preparatory gate layer 74, fifth preparatory gate layer 75 and sixth preparatory gate layer 76) on the second upper substrate 46. For example, the insulation layers 52 may be formed to a certain height by using silicon oxide, silicon nitride, or silicon oxynitride.

The first through sixth preparatory gate layers 71 through 76 may be formed to a certain height by using silicon nitride, silicon carbide, or poly-silicon. The first through sixth preparatory gate layers 71 through 76 may be preparatory layers or sacrificial layers for forming the ground select lines GSL (FIG. 4A), the plurality of word lines WL1 through WL4 (FIG. 4A), and string select lines SSL (FIG. 4A) in subsequent operations. The number of preparatory gate layers may be suitably selected according to the numbers of ground select lines, word lines, and string select lines.

Figure 11G:
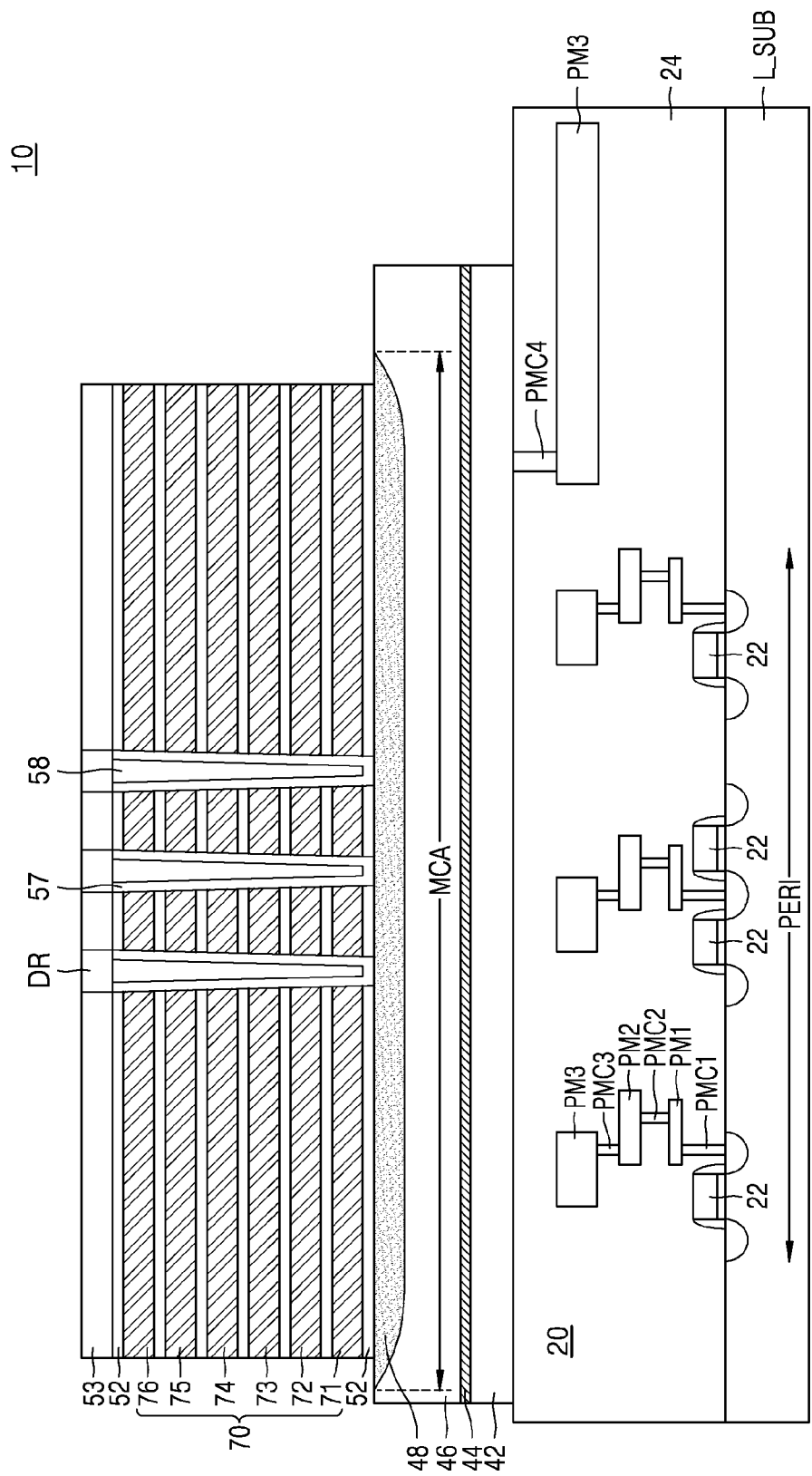

Referring to FIG. 11G, the channel layer 57 and the buried insulation layer 58 penetrating the preparatory gate stack structure 70 and extending in a direction perpendicular to a main surface of the second upper substrate 46 above the well region 48 may be formed. For example, the channel layer 57 may be formed in a channel hole penetrating the preparatory gate stack structure 70 by using impurity-doped poly-silicon through a chemical vapor deposition process, an atomic layer deposition process, or a physical vapor deposition process In some example embodiments, the channel layer 57 may be formed by using poly-silicon that is not doped with an impurity. The buried insulation layer 58 may be formed in the channel hole, in which the channel layer 57 is formed, by using an insulating material such as silicon oxide, silicon nitride, or silicon oxynitride through a chemical vapor deposition process, an atomic layer deposition process, or a physical vapor deposition process.

Next, the etch stop layer 53 covering the top surfaces of the channel layer 57 and the buried insulation layer 58 may be formed on the preparatory gate stack structure 70. The etch stop layer 53 may be formed by using silicon nitride, silicon oxide, or silicon oxynitride.

After a drain hole is formed in the etch stop layer 53 to expose the top surfaces of the channel layer 57 and buried insulation layer 58, a conductive layer (not shown) filling the drain hole may be formed, and the top surface of the conductive layer may be planarized, thereby forming the drain region DR. For example, the top surface of the drain region DR may be formed on a same level as the top surface of the etch stop layer 53.

Figure 11H:
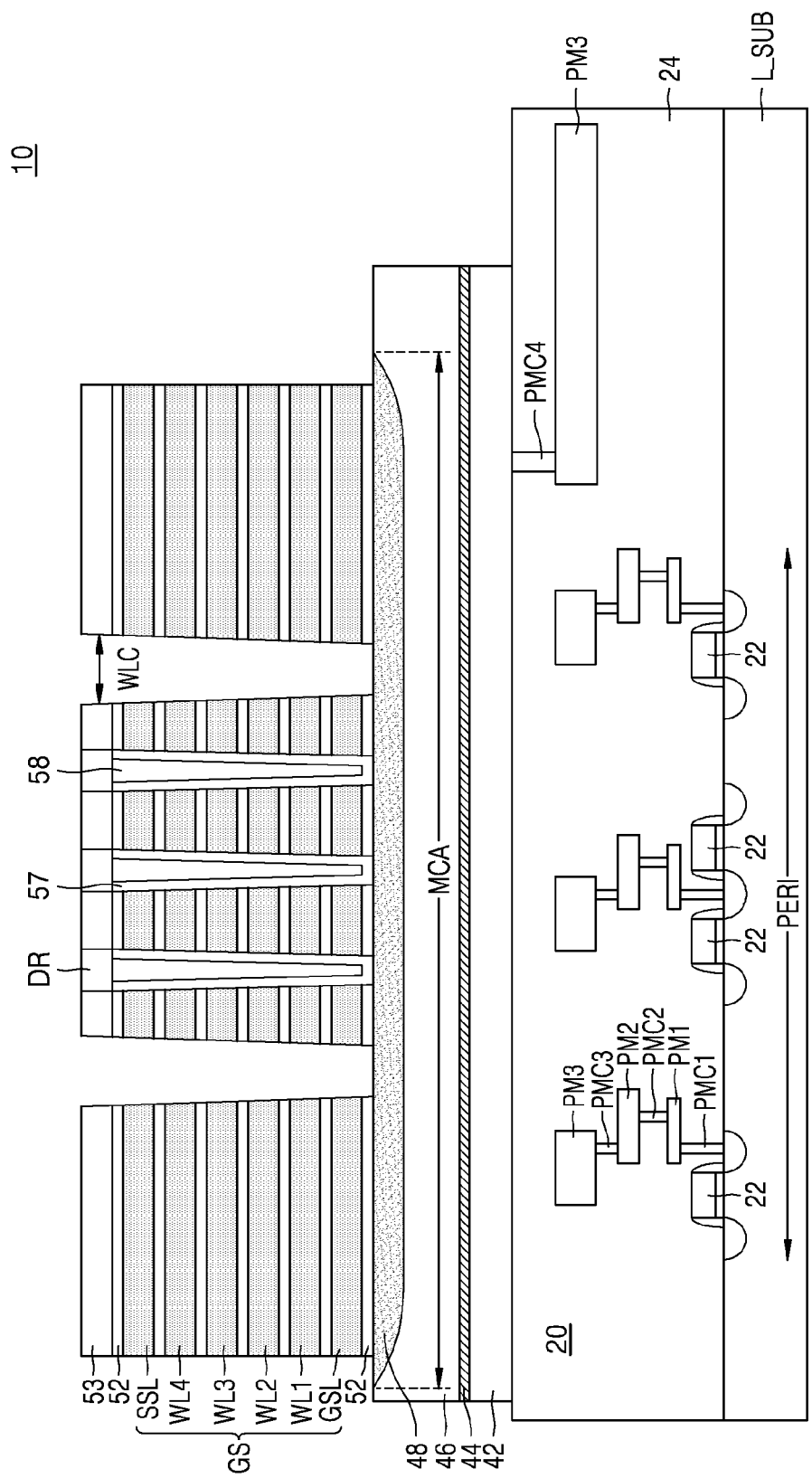

Referring to FIG. 11H, the word line cut region WLC penetrating through the plurality of insulation layers 52 and the preparatory gate stack structure 70 and exposing the well region 48 may be formed. The first through sixth preparatory gate layers 71 through 76 may be replaced into a plurality of gate conductive layers GS, e.g., the ground select line GSL the first through fourth word lines WL1 through WL4, and the string select line SSL.

According to some embodiments for replacing the first through sixth preparatory gate layers 71 through 76 into the ground select line GSL, the first through fourth word lines WL1 through WL4, and the string select line SSL, when the first through sixth preparatory gate layers 71 through 76 include poly-silicon, the silicidation operation may be performed with regard to the first through sixth preparatory gate layers 71 through 76. In this case, the ground select line GSL, the first through fourth word lines WL1 through WL4, and the string select line SSL may include tungsten silicide, tantalum silicide, cobalt silicide, or nickel silicide. However, the inventive concepts are not limited thereto.

According to some other embodiments, after the first through sixth preparatory gate layers 71 through 76 exposed through the word line cut region WLC are selectively removed, a conductive material may be buried in spaces formed between the insulation layers 52, thereby forming the ground select lines GSL, the first through fourth word lines WL1 through WL4, and the string select lines SSL. In this case, the ground select line GSL, the first through fourth word lines WL1 through WL4, and the string select line SSL may be formed by using a metal, such as tungsten, tantalum, cobalt, and nickel.

Figure 11I:
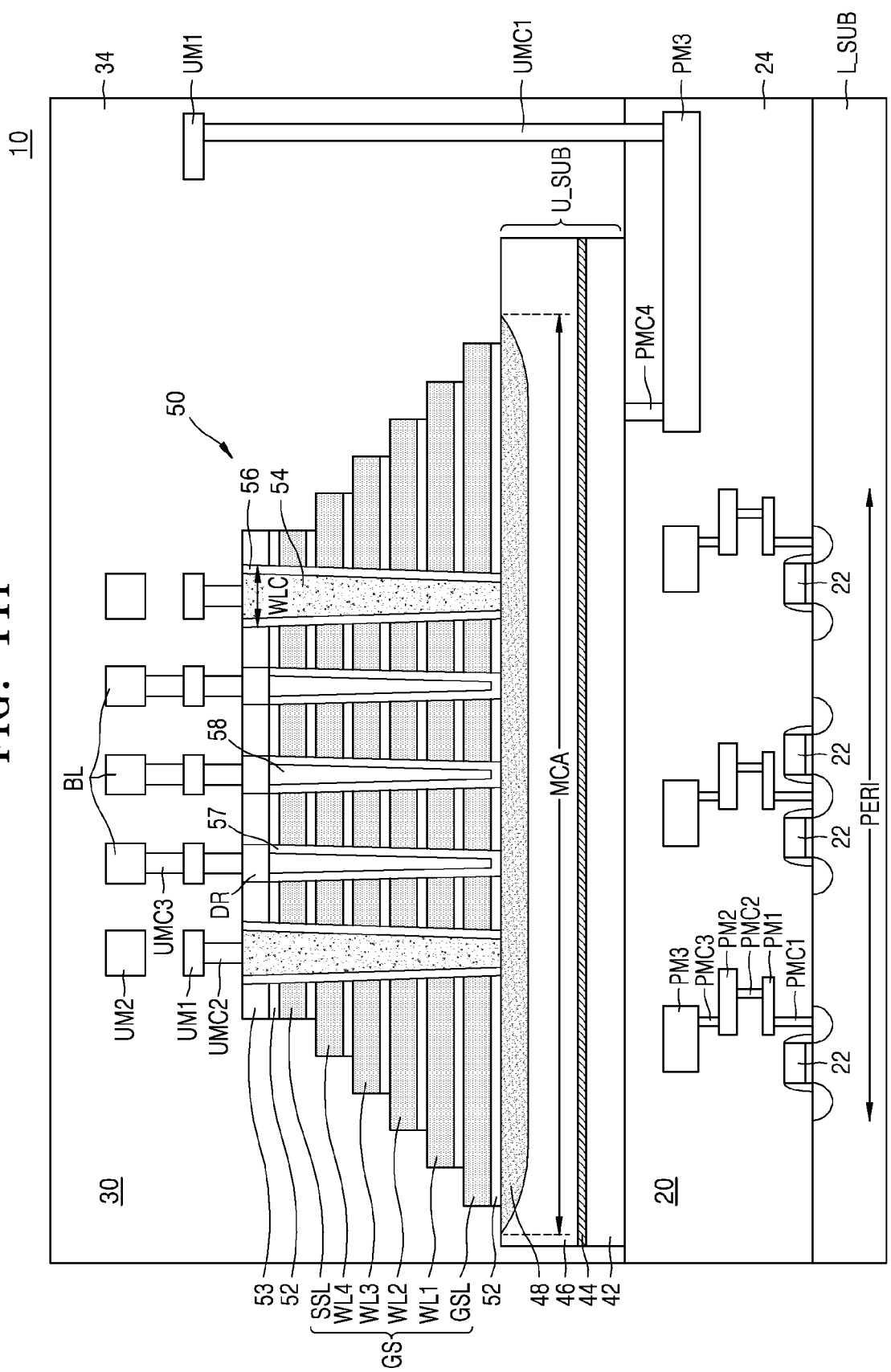

Referring to FIG. 11I, the common source plug 54 and the spacers 56 may be formed in each of the plurality of word line cut regions WLC. The spacers 56 may include silicon oxide, silicon nitride, or silicon oxynitride. The common source plug 54 may include a conductive material. For example, the common source plug 54 may include at least one metal selected from among tungsten (W), aluminum (Al), and copper (Cu). According to some embodiments, a metal silicide layer for reducing a contact resistance may be between the common source plug 54 and the well region 48. For example, the metal silicide layer may include cobalt silicide.

Thereafter, a plurality of patterning processes using a mask (not shown) may be performed to pattern the ground select line GSL, the first through fourth word lines WL1 through WL4, and the string select line SSL. Each of the insulation layers 52 may be patterned so as to be aligned with the adjacent gate conductive layers GS. Therefore, the memory cell array 50 may be formed.

Next, the first through third contacts UMC1 through UMC3, upper wires including the first and second conductive lines UM1 and UM2, and the upper insulation layer 34 may be formed. The second conductive line UM2 may include a bit line BL. The upper insulation layer 34 may cover the upper wires, the memory cell array 50, and the upper substrate U_SUB. According to the operations described above with reference to FIGS. 11B through 11I, the second semiconductor layer 30 may be formed.

Figure 12:
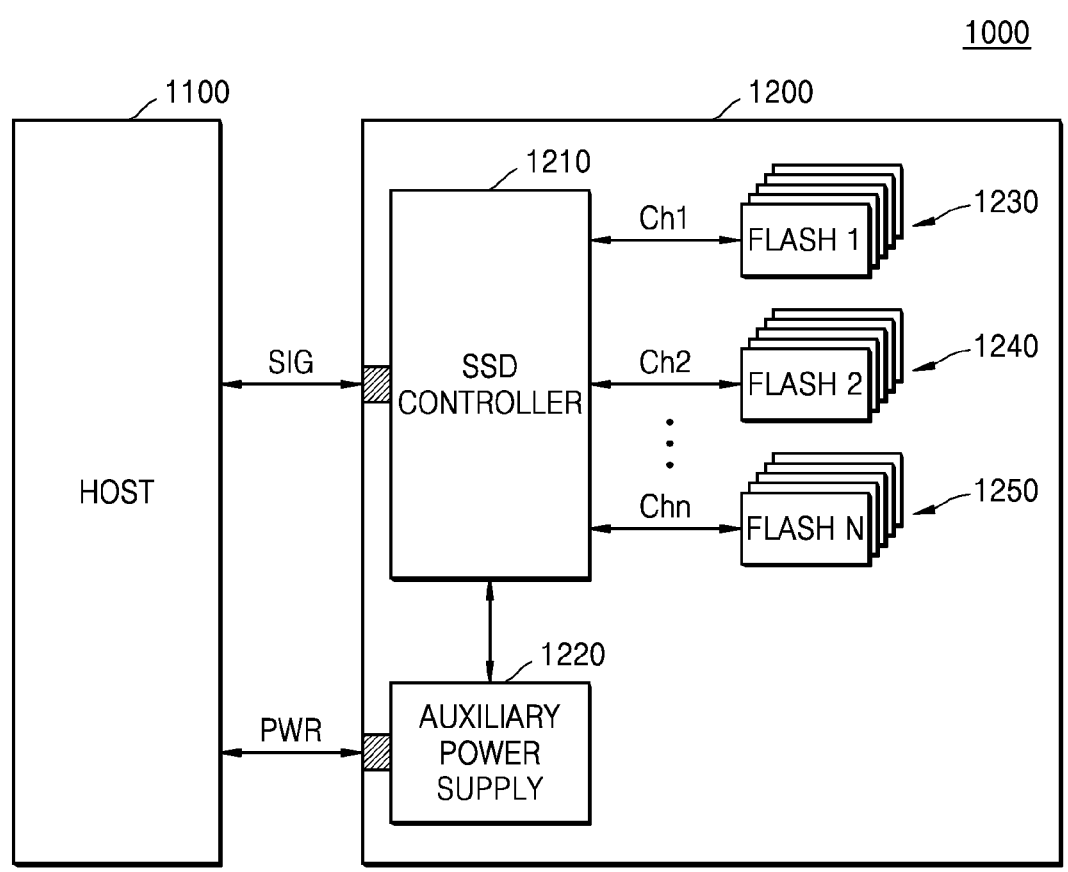
FIG. 12 is a block diagram showing a solid state drive (SSD) system including a memory device according to some example embodiments of the inventive concepts.

FIG. 12 is a block diagram showing a solid state drive (SSD) system 1000 including a memory device according to some example embodiments of the inventive concepts.

Referring to FIG. 12, the SSD system 1000 may include a host 1100 and an SSD 1200. The SSD 1200 may transmit/receive signals to/from the host 1100 through a signal connector and may receive power through a power connector.

The SSD 1200 may include an SSD controller 1210, an auxiliary power supply 1220 and a plurality of memory devices 1230, 1240, and 1250. Each of the plurality of memory devices 1230, 1240, and 1250 may be a vertical stacked NAND flash memory device and may be implemented according to the embodiments described above with reference to FIGS. 1 through 11I. Therefore, each of the plurality of memory devices 1230, 1240, and 1250 may exhibit high integration with improved electrical stability.

While the inventive concepts has been particularly shown and described with reference to embodiments thereof, it will be understood that various changes in form and details may be made therein without departing from the spirit and scope of the following claims.

What is claimed is:

1. A non-volatile memory device comprising:
   a first semiconductor layer including a peripheral region, the peripheral region including one or more peripheral transistors on a lower substrate;
   a second semiconductor layer on the peripheral region, the second semiconductor layer including an upper substrate, the second semiconductor layer further including a memory cell array on the upper substrate, the upper substrate including
      a first upper substrate on the first semiconductor layer,
      a first layer on the first upper substrate, and
      a second upper substrate on the first layer; and
   a contact, the contact extending through a portion of the first semiconductor layer to contact a bottom surface of the first upper substrate to be electrically connected to the first upper substrate, the contact configured to transfer a voltage to the first upper substrate based on an operation signal being applied to the memory cell array.

2. The non-volatile memory device of claim 1, wherein the first layer includes a dielectric layer, and
   the non-volatile memory device further includes a capacitor, the capacitor including the first upper substrate, the second upper substrate, and the first layer.

3. The non-volatile memory device of claim 1, wherein the first upper substrate includes one or more insulation layers, and
   the first upper substrate includes a first section and a second section, the first section and the second section separated by the one or more insulation layers.

4. The non-volatile memory device of claim 3, further comprising:
   a first contact, the first contact electrically connected to the first section, the first contact configured to transfer a first voltage to the first section based on a first operation signal associated with a first operation of the memory cell array being applied to the memory cell array; and
   a second contact, the second contact electrically connected to the second section, the second contact configured to transfer a second voltage to the second section based on a second operation signal associated with a second operation of the memory cell array being applied to the memory cell array, the second voltage having a different magnitude than a magnitude of the first voltage,
   wherein the contact is one of the first contact or the second contact.

5. The non-volatile memory device of claim 1, wherein the first upper substrate and the second upper substrate are doped with an impurity of a first conductivity type, and
   the first layer is doped with an impurity of a second conductivity type, and
   the second conductivity type is opposite to the first conductivity type.

6. The non-volatile memory device of claim 1, wherein the non-volatile memory device is configured to apply a ground voltage to the first upper substrate based on an operation signal associated with an operation of the memory cell array being applied to the second upper substrate.

7. The non-volatile memory device of claim 6, wherein the non-volatile memory device is configured to apply a voltage to the first layer based on the operation signal associated with the operation of the memory cell array being applied to the second upper substrate, the voltage having a magnitude greater than or equal to a magnitude of the ground voltage.

8. The non-volatile memory device of claim 1, wherein
the second upper substrate is doped with an impurity of a first conductivity type, and
the second upper substrate includes a first well region and a second well region, the first well region occupying a portion of the second upper substrate, the first well region doped with an impurity of a second conductivity type, the second conductivity type opposite to the first conductivity type, the second well region occupying a portion of the first well region, the second well region doped with the first conductivity type.

9. The non-volatile memory device of claim 1, wherein the memory cell array includes
a plurality of gate conductive layers on the second upper substrate, and
a plurality of channel layers penetrating the plurality of gate conductive layers, the plurality of channel layers extending in a direction perpendicular to a top surface of the second upper substrate.

10. A non-volatile memory device comprising:
a lower substrate;
a peripheral region on the lower substrate, the peripheral region including a peripheral circuit on the lower substrate;
a memory cell region on the peripheral region, the memory cell region including an upper substrate, the memory cell region further including a memory cell array on the upper substrate, the upper substrate including
a first upper substrate,
a second upper substrate above the first upper substrate, and
a first layer between the first upper substrate and the second upper substrate; and
a contact, the contact extending through a portion of a lower insulation layer between the upper substrate and the lower substrate to contact a bottom surface of the first upper substrate to be electrically connected to the first upper substrate, the contact configured to transfer a voltage to the first upper substrate based on an operation signal being applied to the memory cell array.

11. The non-volatile memory device of claim 10, wherein the upper substrate further includes
a second layer on the second upper substrate, and
a third upper substrate on the second layer.

12. The non-volatile memory device of claim 11, wherein
the first layer includes a dielectric layer, and
the non-volatile memory device further includes a capacitor, the capacitor including the first upper substrate, the second upper substrate, and the first layer.

13. The non-volatile memory device of claim 11, further comprising:
a separate contact, the separate contact penetrating through the second layer and the third upper substrate and extending in a direction perpendicular to a top surface of the second upper substrate,
wherein the non-volatile memory device is configured to apply a ground voltage to the second upper substrate through the separate contact based on the operation signal being applied to the memory cell array.

14. The non-volatile memory device of claim 11, wherein
the first upper substrate, the second upper substrate, and the third upper substrate include poly-silicon doped with an impurity of a first conductivity type, and
the second layer includes poly-silicon doped with an impurity of a second conductivity type, the second conductivity type opposite to the first conductivity type.

15. The non-volatile memory device of claim 10, wherein the non-volatile memory device is configured to apply a power supply voltage associated with the peripheral circuit to the first upper substrate based on an operation signal associated with an operation of the memory cell array being applied to the memory cell region.

16. A method of fabricating a non-volatile memory device, the method comprising:
forming one or more peripheral transistors on a portion of a lower substrate, the one or more peripheral transistors connected to a plurality of peripheral circuit wires, a lower insulation layer covering the one or more peripheral transistors and the peripheral circuit wires;
forming a first upper substrate on the lower insulation layer;
forming a first layer on the first upper substrate;
forming a second upper substrate on the first layer;
forming a memory cell region on the second upper substrate, the memory cell region including a memory cell array; and
forming a contact that extends through a portion of the lower insulation layer to contact a bottom surface of the first upper substrate to be electrically connected to the first upper substrate, the contact configured to transfer a voltage to the first upper substrate based on an operation signal being applied to the memory cell array.

17. The method of claim 16, wherein
the forming of the first upper substrate includes doping the first upper substrate with an impurity having a first conductivity type, and
the forming of the first layer includes doping the first layer with an impurity having a second conductivity type, the second conductivity type opposite to the first conductivity type.

18. The method of claim 16, wherein the forming of the memory cell region includes forming a plurality of gate conductive layers on the second upper substrate and a plurality of channel layers penetrating the plurality of gate conductive layers, the plurality of channel layers extending in a direction perpendicular to a top surface of the second upper substrate.

* * * * *